United States Patent
Jung et al.

(10) Patent No.: US 11,725,076 B2
(45) Date of Patent: Aug. 15, 2023

(54) POLYMER FOR FORMATION OF RESIST UNDERLAYER FILM, COMPOSITION FOR FORMATION OF RESIST UNDERLAYER FILM COMPRISING SAME AND METHOD FOR MANUFACTURING SEMICONDUCTOR ELEMENT BY USING SAME

(71) Applicants: SK Innovation Co., Ltd., Seoul (KR); SK Global Chemical Co., Ltd., Seoul (KR)

(72) Inventors: Minho Jung, Daejeon (KR); Namkyu Lee, Daejeon (KR); Jinsu Ham, Daejeon (KR); Kyunphyo Lee, Daejeon (KR); Kwangkuk Lee, Daejeon (KR); Kwangho Lee, Daejeon (KR); Hyeryoung Lee, Daejeon (KR); Sooyoung Hwang, Daejeon (KR)

(73) Assignees: SK Innovation Co., Ltd., Seoul (KR); SK Geo Centric Co., Ltd., Seoul (KR)

( * ) Notice: Subject to any disclaimer, the term of this patent is extended or adjusted under 35 U.S.C. 154(b) by 633 days.

(21) Appl. No.: 16/633,997

(22) PCT Filed: Jul. 2, 2018

(86) PCT No.: PCT/KR2018/007467
§ 371 (c)(1),
(2) Date: Jan. 24, 2020

(87) PCT Pub. No.: WO2019/022394
PCT Pub. Date: Jan. 31, 2019

(65) Prior Publication Data
US 2020/0199288 A1 Jun. 25, 2020

(30) Foreign Application Priority Data
Jul. 25, 2017 (KR) .......... 10-2017-0094063

(51) Int. Cl.
*G03F 7/004* (2006.01)
*G03F 7/11* (2006.01)
*C08G 61/02* (2006.01)
*H01L 21/027* (2006.01)

(52) U.S. Cl.
CPC .......... *C08G 61/02* (2013.01); *G03F 7/0045* (2013.01); *G03F 7/0048* (2013.01); *G03F 7/11* (2013.01); *H01L 21/027* (2013.01); *C08G 2261/1422* (2013.01); *C08G 2261/1644* (2013.01); *C08G 2261/314* (2013.01)

(58) Field of Classification Search
CPC . G03F 7/11; G03F 7/038; G03F 7/091; G03F 7/09
See application file for complete search history.

(56) References Cited

U.S. PATENT DOCUMENTS

| | | | |
|---|---|---|---|
| 7,981,594 B2 | 7/2011 | Yoon et al. | |
| 10,323,159 B2 | 6/2019 | Kim et al. | |
| 10,340,148 B2 | 7/2019 | Kwon et al. | |
| 2017/0015779 A1* | 1/2017 | Jung | G03F 7/38 |

FOREIGN PATENT DOCUMENTS

| | | |
|---|---|---|
| KR | 1020080107210 A | 12/2008 |
| KR | 1020160042105 A | 4/2016 |
| KR | 1020160099997 A | 8/2016 |
| KR | 1020160107102 A | 9/2016 |
| KR | 1020160142105 A | 12/2016 |
| KR | 1020170045592 A | 4/2017 |

* cited by examiner

*Primary Examiner* — Daborah Chacko-Davis
(74) *Attorney, Agent, or Firm* — The Webb Law Firm

(57) ABSTRACT

The present invention relates to a polymer having a novel structure used in a process for manufacturing a semiconductor and a display; an underlayer film composition for a process for manufacturing a semiconductor and a display, including the same; and a method for manufacturing a semiconductor element by using the same. The novel polymer of the present invention has both optimized etch selection ratio and planarization properties and excellent heat resistance, and thus the underlayer film composition including the same can be used as a hard mask in a semiconductor multilayer lithography process.

17 Claims, No Drawings

POLYMER FOR FORMATION OF RESIST UNDERLAYER FILM, COMPOSITION FOR FORMATION OF RESIST UNDERLAYER FILM COMPRISING SAME AND METHOD FOR MANUFACTURING SEMICONDUCTOR ELEMENT BY USING SAME

CROSS-REFERENCE TO RELATED APPLICATIONS

This application is the United States national phase of International Application No. PCT/KR2018/007467 filed Jul. 2, 2018, and claims priority to Korean Patent Application No. 10-2017-0094063 filed Jul. 25, 2017, the disclosures of which are hereby incorporated by reference in their entirety.

TECHNICAL FIELD

The following disclosure relates to a novel polymer used for a manufacturing process of a semiconductor and a display, an underlayer film composition including the polymer for a manufacturing process of a semiconductor and a display, and a method for manufacturing semiconductor device using the composition. More particularly, since the novel polymer of the present invention has optimized etch selection ratio and planarization property, and excellent thermal resistance at the same time, an underlayer film composition including the polymer may be used as a hard mask in a semiconductor multilayer lithography process.

BACKGROUND ART

As size of patterns is rapidly decreased in accordance with miniaturization and high integration of semiconductor devices, a collapse phenomenon of photoresist patterns has emerged as the hardest part during processes, and accordingly, it is inevitable that a thickness of a photoresist film becomes gradually thinner to achieve a high resolution image. However, since it is difficult to etch a layer to be etched with sufficient etching selectivity by using patterns formed with a thinner photoresist, an inorganic or organic film having strong etching resistance is introduced between the layer to be etched and the photoresist. This inorganic or organic film refers to a hard mask, and a hard mask process refers to a general process of etching the hard mask using the photoresist patterns to perform patterning, and etching the layer to be etched using the patterns of the hard mask. The hard mask used for the hard mask process is formed by using various films such as polysilicon, silicon nitride, silicon oxynitride, titanium nitride, amorphous carbon, etc., and is conventionally manufactured by chemical vapor deposition (CVD).

The hard mask formed by the chemical vapor deposition has good physical properties in view of etching selectivity or etching resistance, but has problems such as particle occurrence, void occurrence in a part having large steps, etc., particularly, high investment cost for initial equipment. In order to solve these problems, a need for developing a spin-on hard mask composition that is easily capable of performing spin-coating using a track system used in a photolithography process in a semiconductor line instead of using the deposited hard mask has emerged, and development of specific materials for solving these problems has been attempted. The hard mask (spin-on hard mask) formed by the spin-coating has difficulty in obtaining the same etching resistance as the hard mask formed by a CVD process. However, the hard mask formed by the spin-coating has advantages in that it is easier to form a thin film by a solution stage of coating, and coating uniformity and roughness of a thin film surface are improved, etc. In addition, the initial investment cost of the hard mask formed by the spin-coating is less than that of the hard mask formed by a CVD process.

As described above, the recent trend of miniaturization of a lithography process according to continuous high integration of an LSI (large scale integrated) circuit has reached the limit for being implemented as an argon fluoride immersion lithography photoresist which is the top in the existing photoresist. In particular, in order to perform an ultrafine patterning process of 30 nm node or less, resolution of the photoresist used in the lithography process functions as an important factor. However, since the existing photoresist has a limitation in implementing patterns of 30 nm or less, development of a novel additional process has been attempted to overcome the limitation.

Technologies that are practically applied among a number of currently developed technologies are mainly a double patterning method in which primary and secondary exposure processes and an etching process are performed and a double patterning process (SPT, Spacer Patterning Technology) using a spacer, and materials used as a hard mask in the additional process commonly refer to an underlayer film composition. It is noted that in addition to the use of amorphous carbon as a hard mask, the used amount of the underlayer film composition has rapidly increased as a novel hard mask material in a situation in which the double patterning process which is a process for implementing new high resolution generally leads in the industry for an ArF lithography process. The main physical properties that are required for the underlayer film include high etching resistance, thermal stability, excellent solubility to general organic solvents, storage stability, adhesion property, and excellent coating uniformity, etc. The reason for requiring thermal stability is that an underlayer film is formed, and then, a vacuum deposition process at high temperature is performed on an upper part thereof as a subsequent process, wherein in view of thermal resistance, low decomposition of a polymer at 400° C. and a film decrease by 5% or less are generally required for a stable vacuum deposition process. The etching resistance is another factor that is significantly important for etching an underlayer while having the minimum thickness as the underlayer film. The reason is because as a thickness of the film is increased, risk that patterns may naturally collapse during the process is increased. The etching resistance is favorable as carbon content of a polymer is high, but it is preferred that the carbon content of the polymer is 82% or more in consideration of solubility to a solvent, coating uniformity, etc.

In the related art, polymers having high carbon content and polarity and high thermal stability have been mainly studied as a polymer material in a composition in order to satisfy characteristics of the underlayer film material as described above, and in particular, polyamide, polyetheretherketone, polyaryl ether, other phenolic polymers, etc., have been variously studied. It was confirmed that some of the polymers had sufficient high-temperature stability and a film-forming ability. However, when polymers have desired level of carbon contents related with etching resistance, the polymers have problems in view of storage stability, line compatibility, and coating uniformity due to rapid decrease in solubility. When polymers have insufficient thermal resistance, the polymers have a problem in that a gas emission amount is large during the process due to low thermal stability.

That is, physical properties of the underlayer film composition are dependent on characteristics of the polymer. In particular, thermal stability and etching resistance in the characteristics of the polymer are intactly reflected in the characteristics of the underlayer film composition. The thermal stability is dependent on stability of a polymer main chain, and the etching resistance is excellent as carbon content present in the polymer is high. Examples of the polymer having excellent thermal stability may include polyimide, polyamide, polyarylketone ether, etc. However, the polymers having excellent thermal stability have limitation in being used as the underlayer film material since etching resistance is decreased or solubility with respect to general organic solvents is low.

In addition, surface planarization and uniformity of pattern edges may be controlled by a molecular weight of the polymer or an additive. Other mechanical properties of the pattern are also determined by kinds and structures of the polymer.

DISCLOSURE

Technical Problem

In order to complement the above problems, the present inventors synthesized a novel polymer which has excellent thermal stability and coating uniformity, and may improve etching resistance, and found that the novel polymer had excellent thermal stability, etching resistance, and coating uniformity, and simultaneously had high solubility to organic solvents conventionally used in a semiconductor process even though the polymer had high carbon content, thereby remarkably improving storage stability and line compatibility, and completed the present disclosure.

An embodiment of the present disclosure is directed to providing a polymer for preparing an underlayer film having excellent thermal stability, etching resistance, and coating uniformity.

Another embodiment of the present disclosure is directed to providing an underlayer film composition including the polymer for preparing an underlayer film, having excellent thermal stability, etching resistance, surface planarization degree and gap fill property, and superior mechanical physical properties of a pattern.

Still another embodiment of the present disclosure is directed to providing a method for manufacturing a semiconductor device using the underlayer film composition.

Technical Solution

In one general aspect, there is provided a polymer for preparing a resist underlayer film including: a repeating unit represented by Chemical Formula 1 below:

[Chemical Formula 1]

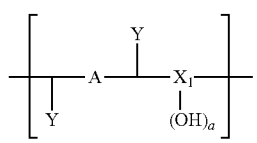

wherein
Y is a substituted or unsubstituted C6-C30 aromatic ring;
A is a substituted or unsubstituted C6-C30 aromatic ring;
$X_1$ is a C10-C30 aromatic ring;
a is an integer of 1 to 4; and
the sum of carbon atoms of Y, A and $X_1$ is at least 30.

In addition, in another general aspect, there is provided a resist underlayer film composition containing the polymer including the repeating unit represented by the above Chemical Formula 1; and an organic solvent.

Further, in another general aspect, there is provided a method for forming a resist underlayer film including: a) applying the resist underlayer film composition as described above on a substrate, the resist underlayer film composition including the polymer for preparing the resist underlayer film including the repeating unit represented by Chemical Formula 1; and the organic solvent; and b) forming a resist underlayer film by heating the substrate of step a).

In addition, in another general aspect, there is provided a method for manufacturing semiconductor device including: a) forming a resist underlayer film by applying and heating the resist underlayer film composition as described above on a substrate; b) forming a photoresist film on the resist underlayer film of step a); c) forming photoresist patterns by exposing and developing the substrate to which the resist underlayer film and the photoresist film of step b) are applied; d) etching the resist underlayer film by using the photoresist patterns of step c) as an etching mask to thereby expose the substrate in a form of the patterns; and e) etching an exposed part of the substrate.

Advantageous Effects

The novel polymer of the present disclosure represents excellent thermal resistance, in addition to an optimized etch selectivity and a planarization property, due to a high carbon content, and thus, the resist underlayer film composition including the polymer may form a hard mask (spin-on carbon (SOC) hard mask) by spin coating in a semiconductor multilayer lithography process, and has less occurrence of fumes in a post process heated at 400° C., thereby being useful as a high temperature SOC material.

The resist underlayer film composition of the present disclosure shows excellent etching resistance, thermal stability and coating uniformity due to the novel polymer, and in particular, in spite of a high carbon content, has excellent solubility in an organic solvent, thereby representing an effect of significantly improving storage stability and line compatibility in a semiconductor process.

In addition, the resist underlayer film formed according to the present disclosure has excellent thermal stability, and an excellent gap fill property even at the time of being applied on a wafer having a step difference, thereby having an excellent planarization degree. Further, the resist underlayer film formed according to the present disclosure has excellent etching resistance to thereby serve as a protective layer (hard mask) for forming shapes of predetermined patterns at the time of a dry-etching process, may minimize a loss of the mask as the etching speed of the resist film becomes fast or slow, and to increase an etching amount of the underlayer film.

In addition, even in the case in which the resist underlayer film formed by using the resist underlayer film composition of the present disclosure is subjected to a photolithography process and an etching process, the resist underlayer film has excellent results in view of pattern fidelity, CD (critical dimension) uniformity, surface roughness, etc.

BEST MODE

Hereinafter, exemplary embodiments of the present invention will be described in detail so as to be easily practiced by a person skilled in the art to which the present invention pertains. However, the present invention may be implemented in various different forms and is not limited to the exemplary embodiments described herein.

In addition, unless otherwise defined, all technical terms and scientific terms have the same meanings as those commonly understood by a person skilled in the art to which the present invention pertains, the terms used herein is only for effectively describing a certain exemplary embodiment, and not intended to limit the present invention.

In addition, the singular form used in the specification and claims appended thereto may be intended to also include a plural form, unless otherwise indicated in the context.

An "aromatic ring" in the present invention is an aromatic hydrocarbon compound, and includes a single- or fused ring system containing appropriately 4 to 7, preferably 5 or 6 ring atoms in each ring, and even a form in which a plurality of aromatic rings is linked by a single bond. In addition, the "aromatic ring" may have the desired number of binding sites by removal of at least one hydrogen.

In the present invention, unless otherwise defined, 'substituted' means that a hydrogen atom in a compound is substituted with any one or two or more substituents selected from the group consisting of halogen atoms (F, Br, Cl or I), carboxyl, cyano, nitro, oxo (=O), thio (=S), hydrocarbyl, halohydrocarbyloxy, hydrocarbyloxy, hydrocarbyloxycarbonyl, hydrocarbylcarbonyloxy, aminocarbonyl, hydrocarbylcarbonylamino, hydrocarbylthio, hydrocarbylsilyl, amino, hydrocarbylamino, heterohydrocarbyl, hydrocarbylidene, and the like.

Specifically, it means being substituted by any one or more selected from the group consisting of halogen, carboxyl, cyano, nitro, oxo(=O), thio(=S), C1-C20alkyl, haloC1-C20alkoxy, C2-C20alkenyl, C2-C20alkynyl, C6-C20aryl, C6-C20aryloxy, C1-C20alkoxycarbonyl, C1-C20alkylcarbonyloxy, C2-C20alkenylcarbonyloxy, C2-C20alkynylcarbonyloxy, aminocarbonyl, C1-C20-alkylcarbonylamino, C2-C20alkenylcarbonylamino, C2-C20alkynylcarbonylamino, SR', NR"R'" (R', R" and R'" are independently of one another hydrogen, C1-C20alkyl, C2-C20alkenyl, C2-C20alkynyl, C3-C20cycloalkyl or C6-C20aryl), C1-C20alkylsilyl, C2-C20alkenylsilyl, C2-C20alkynylsilyl, C6-C20arylsilyl, C6-C20arylC1-C20alkyl, C6-C20arylC2-C20alkenyl, C6-C20arylC2-C20alkynyl, C3-C20cycloalkyl, C3-C20cycloalkylC1-C20alkyl, C3-C20cycloalkenyl, C6-C20heteroaryl, C3-C20heterocycloalkyl ring, C3-C20heteroarylC1-C20alkyl, C3-C20heterocycloalkyl, C1-C20alkylidene and C3-C20cycloalkylidene.

In the present invention, "hydrocarbyl" or "heterohydrocarbyl" refers to a radical having one binding site derived from hydrocarbon or heterohydrocarbon, and "hetero" means that a carbon is substituted by one or more atoms selected from the group consisting of O, S and N atoms.

In the present invention, "alkyl" refers to a monovalent straight-chain or branched-chain saturated hydrocarbon radical consisting of only carbon and hydrogen atoms, and an example of the alkyl radical includes methyl, ethyl, propyl, isopropyl, butyl, isobutyl, t-butyl, pentyl, hexyl, octyl, nonyl, or the like, but not limited thereto.

In the present invention, "aryl" refers to an organic radical derived from aromatic hydrocarbon by removal of one hydrogen, including a single- or fused ring system containing appropriately 4 to 7, preferably 5 or 6 ring atoms in each ring, and even a form in which a plurality of aryls is linked by a single bond. A fused ring system may include an aliphatic ring such as saturated or partially saturated rings, and necessarily includes one or more aromatic rings. In addition, the aliphatic ring may contain nitrogen, oxygen, sulfur, carbonyl and the like in the ring. The specific example of the aryl radical includes phenyl, naphthyl, biphenyl, indenyl, fluorenyl, phenanthrenyl, anthracenyl, triphenylenyl, pyrenyl, chrysenyl, naphthacenyl, 9,10-dihydroanthracenyl and the like.

In the present invention, "cycloalkyl" represents a monocyclic, bicyclic or tricyclic ring system. A monocyclic ring system is exemplified by a saturated cyclic hydrocarbon group containing 3 to 8 carbon atoms. An example of the monocyclic ring system includes cyclopropyl, cyclobutyl, cyclopentyl, cyclohexyl, cycloheptyl and cyclooctyl. A bicyclic ring system is also exemplified by a bridged monocyclic ring system in which two non-adjacent carbon atoms of a monocyclic ring are linked by an alkylene bridge between one and three additional carbon atoms. An example of the bicyclic ring system includes bicyclo[3.1.1]heptane, bicyclo[2.2.1]heptane, bicyclo[2.2.2]octane, bicyclo[3.2.2]nonane, bicyclo[3.3.1]nonane and bicyclo[4.2.1]nonane, but not limited thereto. A tricyclic ring system is also exemplified by a bicyclic ring system in which two non-adjacent carbon atoms of a bicyclic ring are linked by a bond or an alkylene bridge between one and three carbon atoms. A representative example of the tricyclic ring system includes tricyclo[3.3.1.03,7]nonane and tricyclo[3.3.1.13,7]decane(adamantane), but not limited thereto.

In the present invention, "alkoxy", "cycloalkyloxy" and "aryloxy" refer to an —O-alkyl radical, an —O-cycloalkyl radical and an —O-aryl radical, respectively, wherein 'alkyl', 'cycloalky' and 'aryl' are as defined above.

Hereinafter, the present invention will be described in detail.

The present disclosure provides a novel polymer including a repeating unit represented by the following Chemical Formula 1, as a core material for preparing a composition having excellent physical properties of an underlayer film used in a manufacturing process of a semiconductor and a display:

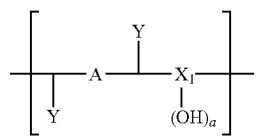

[Chemical Formula 1]

wherein
Y is a substituted or unsubstituted C6-C30 aromatic ring;
A is a substituted or unsubstituted C6-C30 aromatic ring;
$X_1$ is a C10-C30 aromatic ring;
a is an integer of 1 to 4; and
the sum of carbon atoms of Y, A and $X_1$ is at least 30.

In an exemplary embodiment of the present disclosure, A may be an aromatic ring selected from the following structures, and a bonding position to which an aromatic ring is bonded may be selected from carbon atoms of the aromatic ring of the following structures:

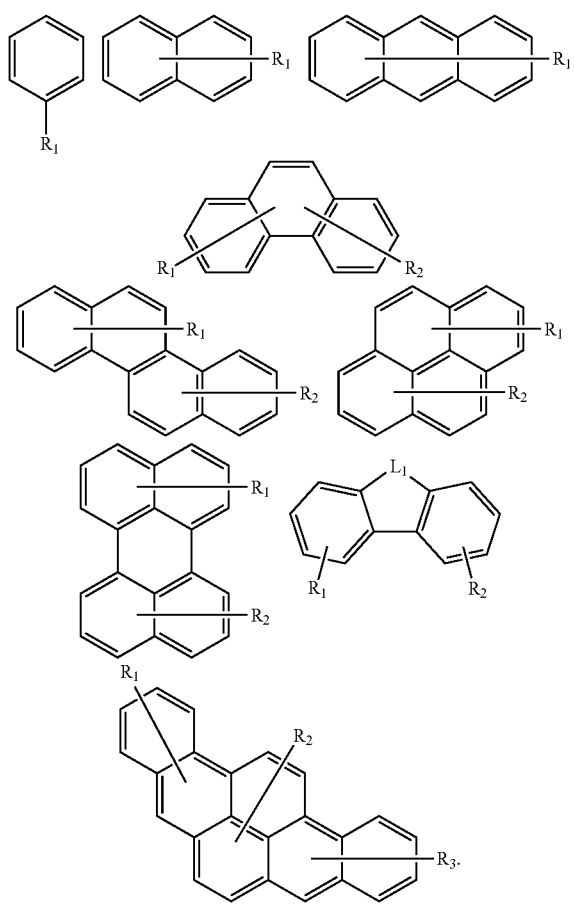

wherein $R_1$ to $R_3$ are independently of one another hydrogen, C1-C20 alkoxy, C3-C20 cycloalkyloxy, C6-C20 aryloxy, $SR_4$ or $NR_5R_6$;

$R_4$ to $R_6$ are independently of each other hydrogen, C1-C20 alkyl, C3-C20 cycloalkyl, or C6-C20 aryl;

$L_1$ is $CR_7R_8$ or $C=R_9$;

$R_7$ and $R_8$ are independently of each other hydrogen, C1-C20 alkyl, C3-C20 cycloalkyl, or C6-C20 aryl; and $R_9$ is C1-C20 alkylidene or C3-C20 cycloalkylidene.

In an exemplary embodiment of the present disclosure, Y may be an aromatic ring selected from the following structures, and a bonding position to which an aromatic ring is bonded may be selected from carbon atoms of the aromatic ring of the following structures:

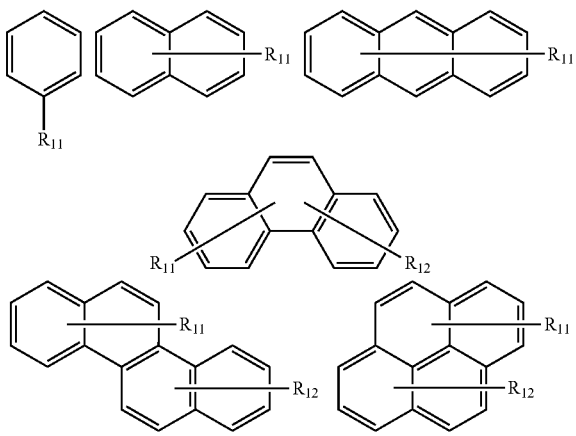

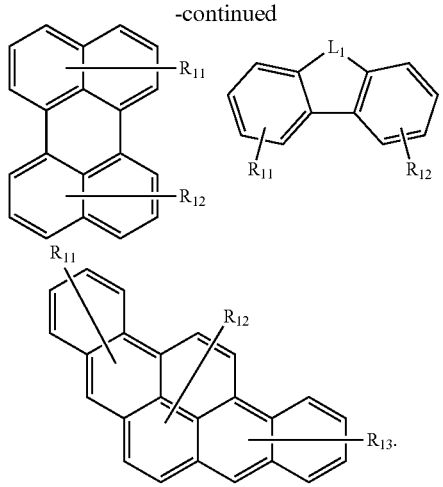

wherein $R_{11}$ to $R_{13}$ are independently of one another hydrogen, C1-C20 alkoxy, C3-C20 cycloalkyloxy, C6-C20 aryloxy, $SR_{14}$ or $NR_{15}R_{16}$;

$R_{14}$ to $R_{16}$ are independently of each other hydrogen, C1-C20 alkyl, C3-C20 cycloalkyl, or C6-C20 aryl;

$L_{11}$ is $CR_{17}R_{18}$ or $C=R_{19}$;

$R_{17}$ and $R_{18}$ are independently of each other hydrogen, C1-C20 alkyl, C3-C20 cycloalkyl, or C6-C20 aryl; and $R_{19}$ is C1-C20 alkylidene or C3-C20 cycloalkylidene.

In an exemplary embodiment of the present disclosure, the polymer may include a part represented by the following Chemical Formula 2:

[Chemical Formula 2]

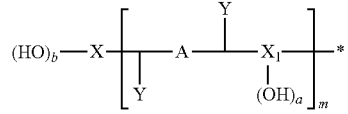

wherein

X is a C10-C30 aromatic ring;

Y is a substituted or unsubstituted C6-C30 aromatic ring;

A is a substituted or unsubstituted C6-C30 aromatic ring;

$X_1$ is a C10-C30 aromatic ring;

a and b are independently of each other an integer of 1 to 4; and m is an integer of 1 to 30.

In an exemplary embodiment of the present disclosure, X and $X_1$ may be independently of each other an aromatic ring selected from the following structures, and a bonding position to which an aromatic ring is bonded may be selected from carbon atoms of the aromatic ring of the following structures:

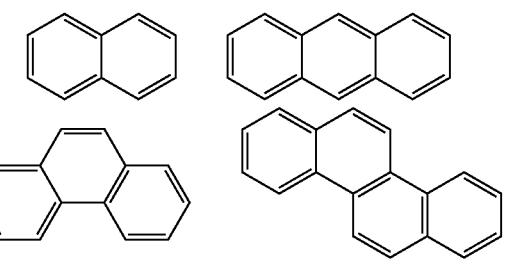

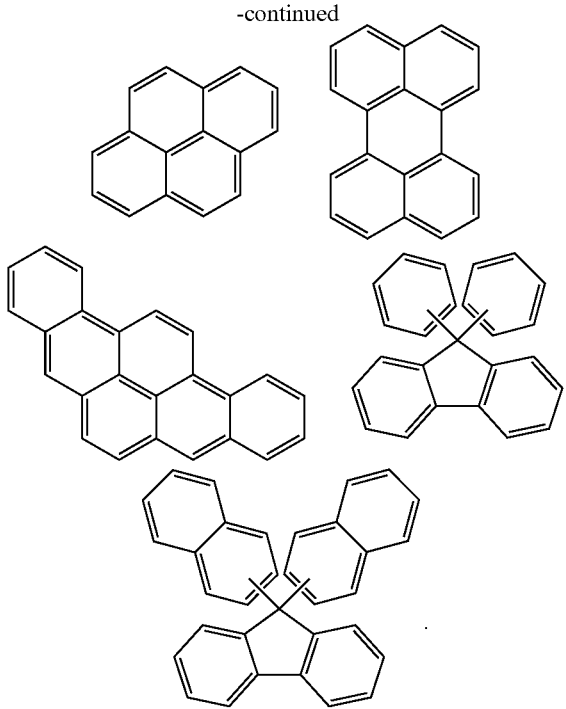

In an exemplary embodiment of the present disclosure, the sum of carbon atoms of two Y's, A and $X_1$ in the polymer is at least 30, and the polymer includes at least two polycyclic aromatic rings, thereby having a maximum carbon density equal to or more than a certain amount in the repeating unit of the polymer, and thus, the polymer represents excellent etching resistance, and also has excellent selectivity to etch gas as compared with a substrate.

In an exemplary embodiment of the present disclosure, the polymer includes a repeating unit in which Y is substituted on both sides of A in the repeating unit, and as the substituted Y on both sides of A is identical to each other as such, the polymer has a maximum carbon density equal to or more than a certain amount in the repeating unit of the polymer, and thus, represents excellent etching resistance, and also has excellent selectivity to etch gas as compared with a substrate.

In an exemplary embodiment of the present disclosure, the polymer has excellent etching resistance and coating uniformity, and also excellent thermal stability, and though the polymer has a high carbon content, has excellent solubility in an organic solvent, thereby capable of effectively forming a resist underlayer film by a spin-on coating method. In addition, when the polymer is formed on the underlayer film having predetermined patterns by the spin-on coating method, the resist underlayer film containing the polymer has an excellent gap-fill characteristic capable of filling a gap between the patterns and a planarization characteristic, and is usable as a hard mask for a semiconductor multilayer lithography process. Further, the polymer for preparing a resist underlayer film according to the present disclosure may have excellent solubility to organic solvents even though the polymer has high carbon content, thereby improving storage stability.

In an exemplary embodiment of the present disclosure, the polymer has a weight average molecular weight (Mw) in terms of polystyrene by gel permeation chromatography (GPC) of 500 g/mol or more, however, for improving ease of manufacture and handling of the underlayer film composition, film formation, coating uniformity, a hole filling characteristic and solubility, the polymer has a weight average molecular weight of 500 to 50,000 g/mol, preferably 800 to 20,000 g/mol, and more preferably 800 to 10,000 g/mol. When the polymer has a weight average molecular weight less than 500 g/mol, coating uniformity is deteriorated.

In an exemplary embodiment of the present disclosure, the polymer may include a structure selected from the following structures, but not limited thereto. In addition, the bonding position to which a hydroxyl group is bonded in the following structure is not limited, but may be selected from substitutable carbon atoms in the aromatic ring:

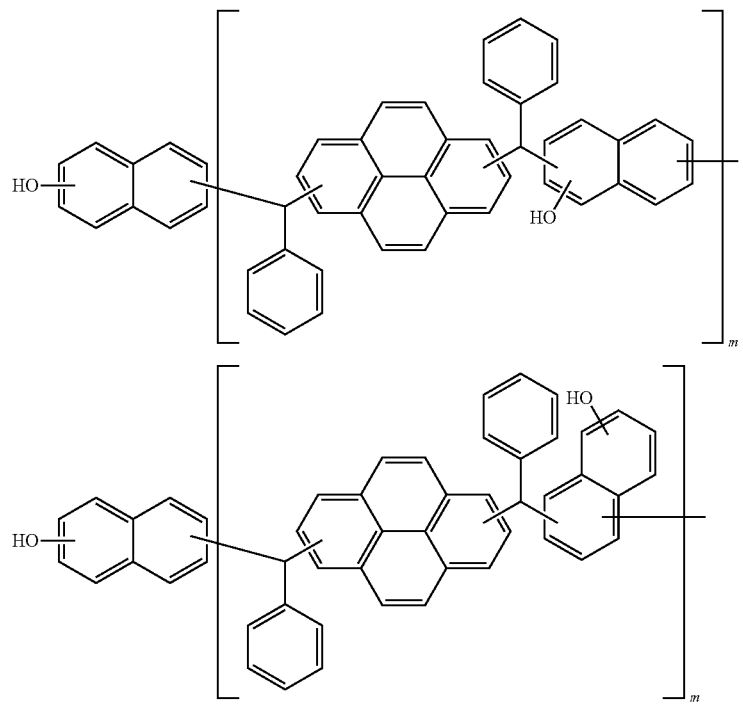

-continued
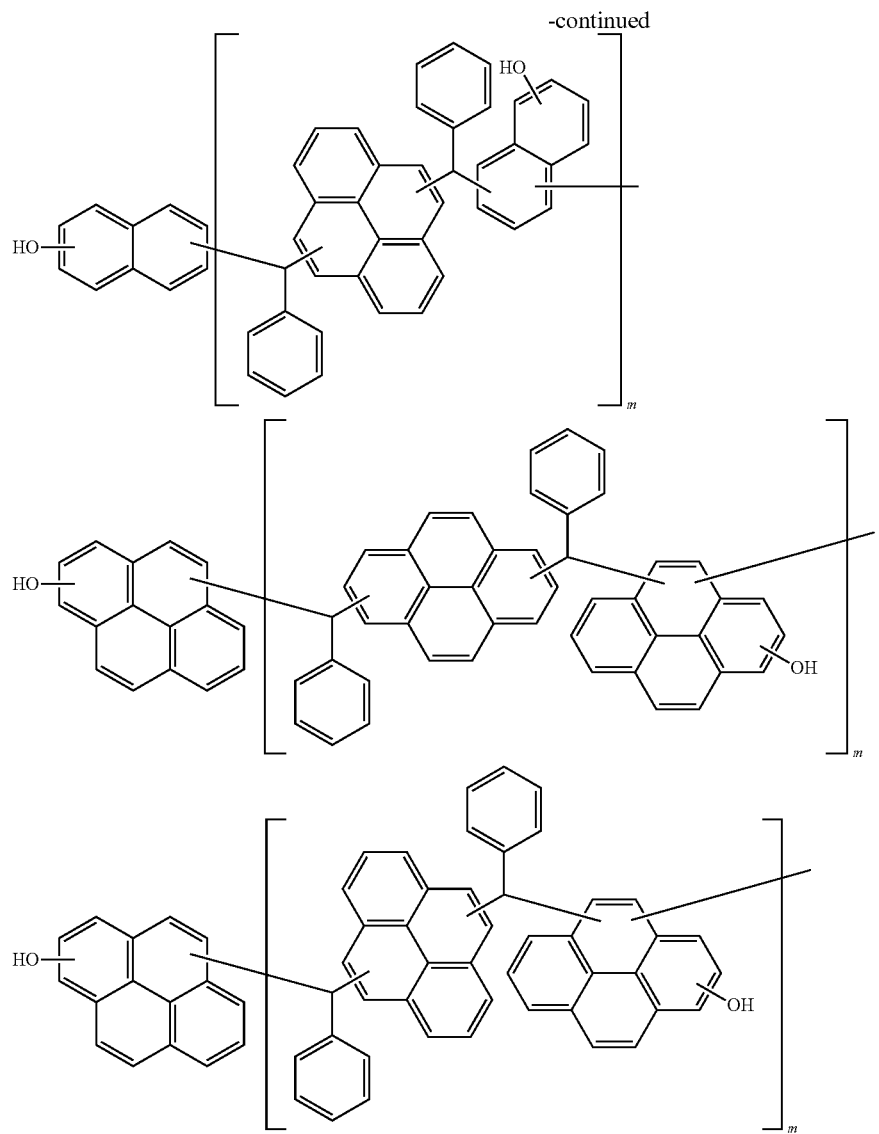
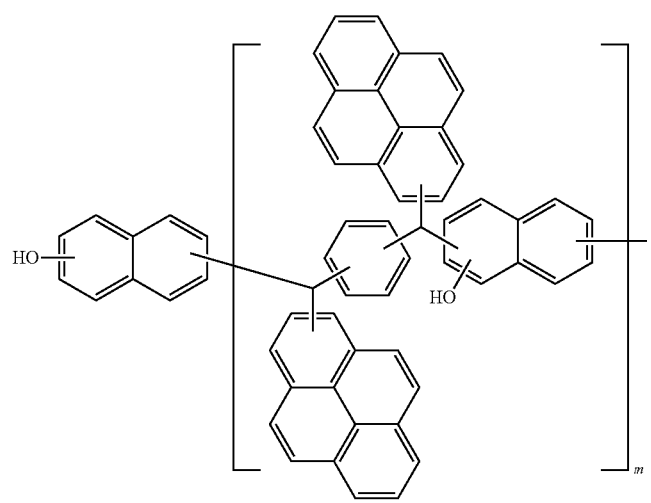

-continued
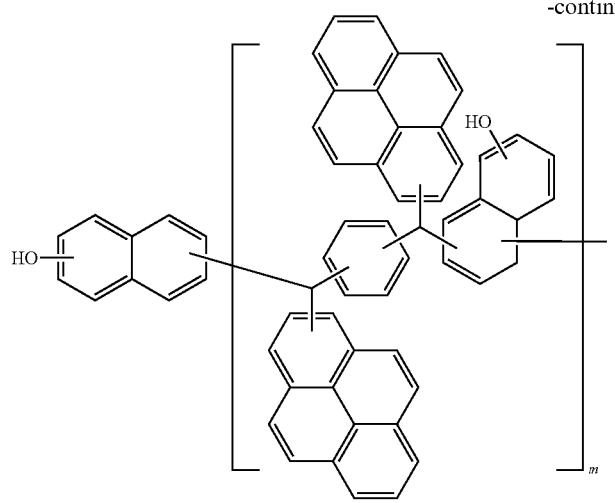
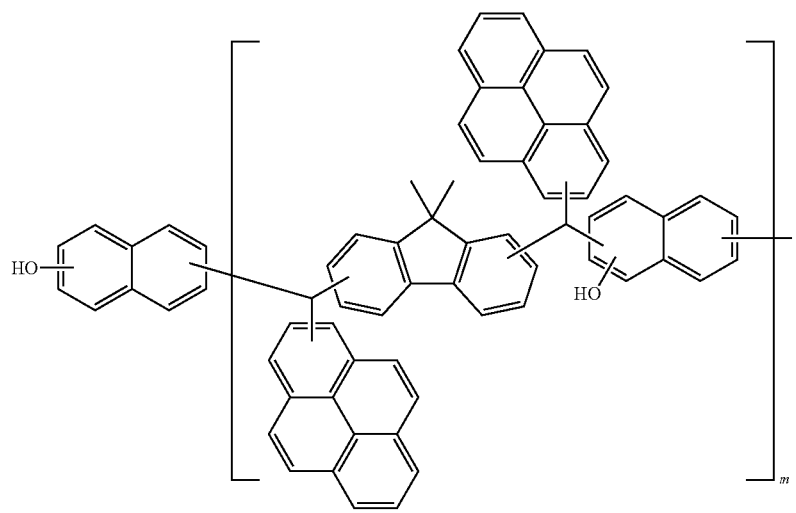
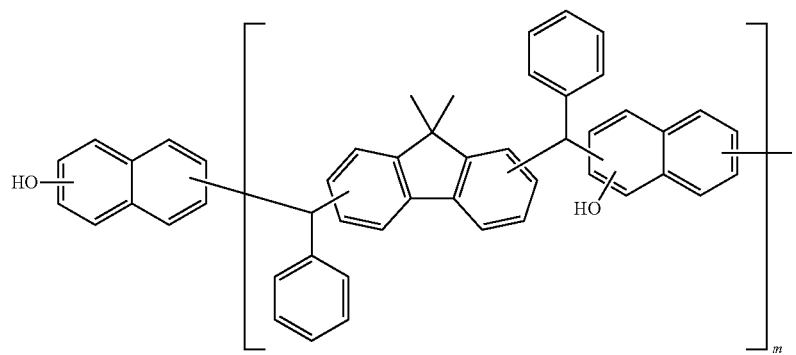

-continued
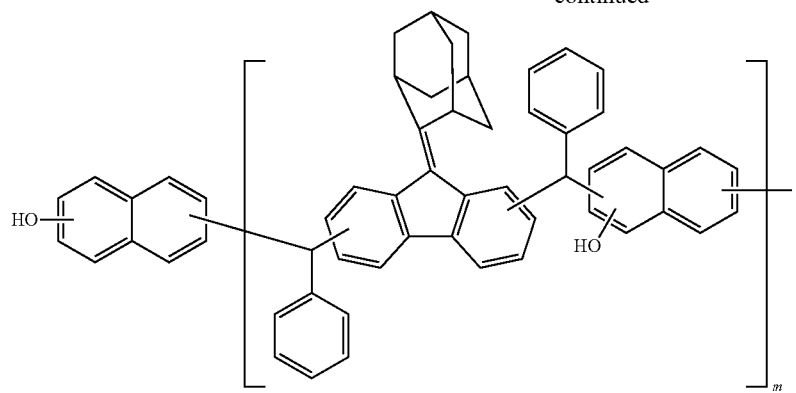
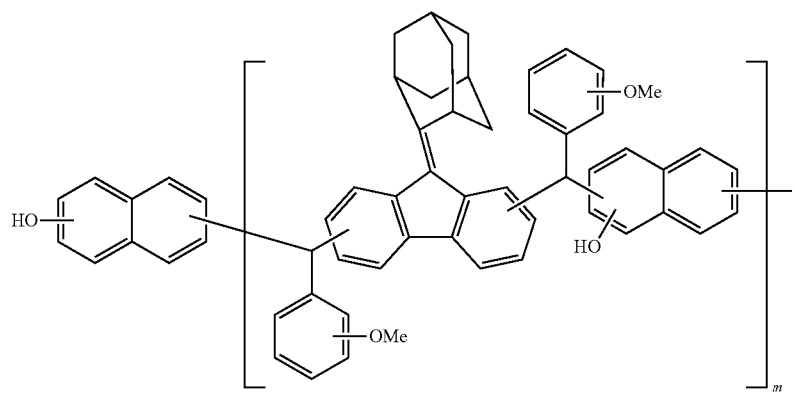
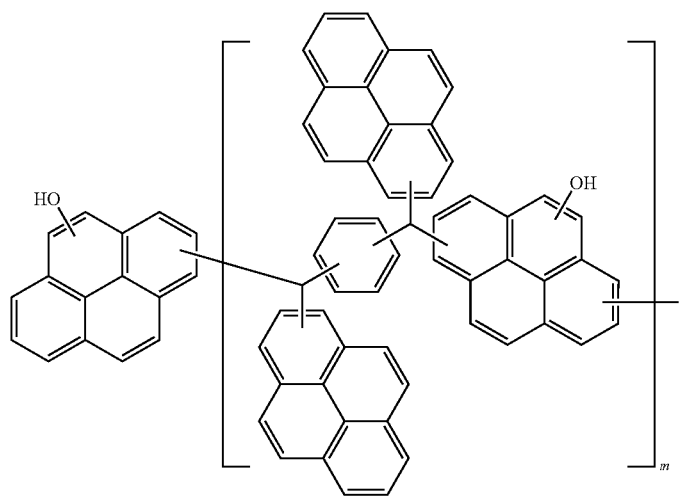

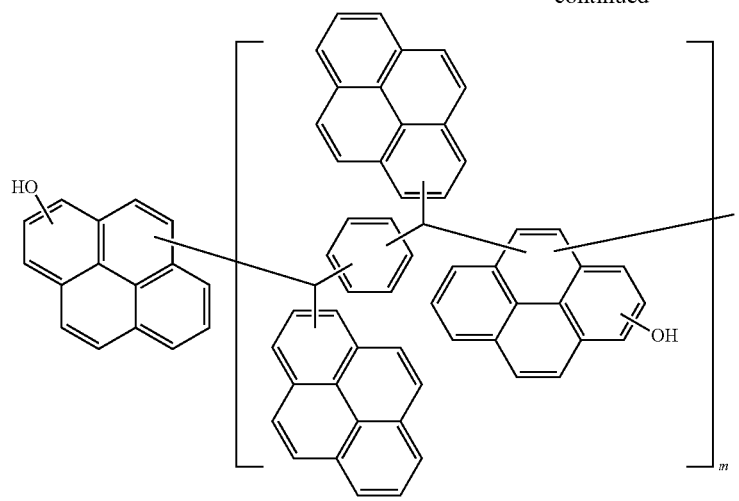
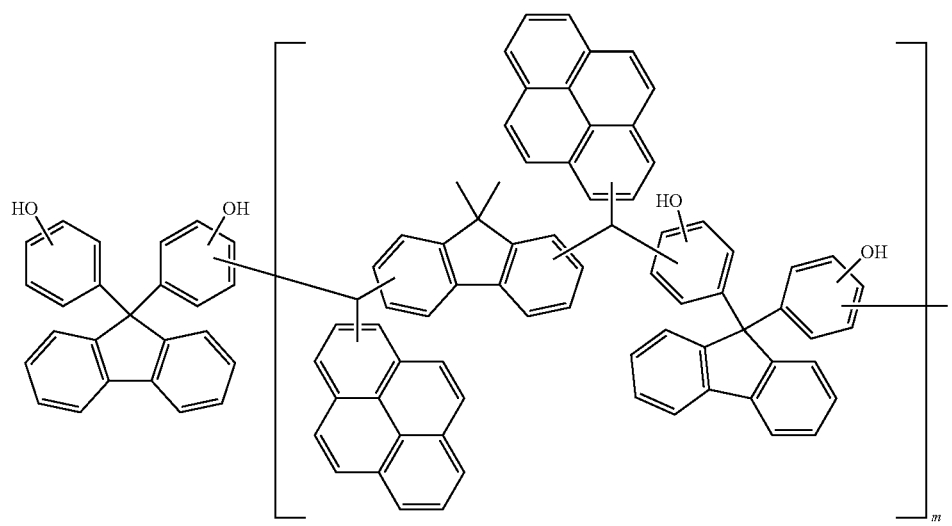
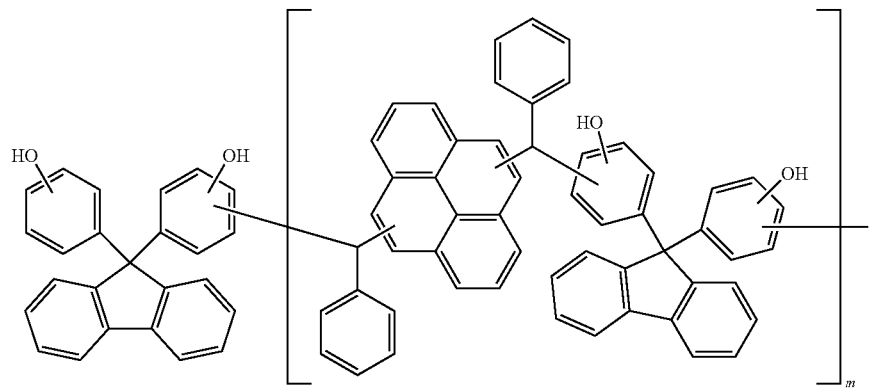

-continued
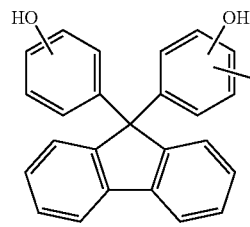 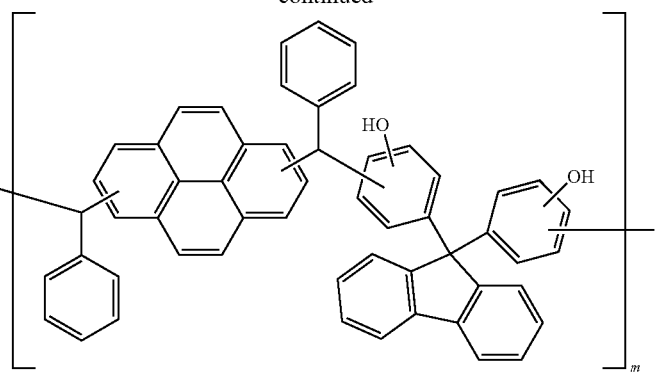
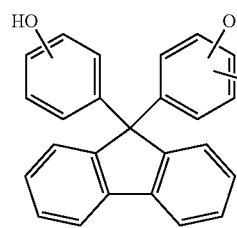 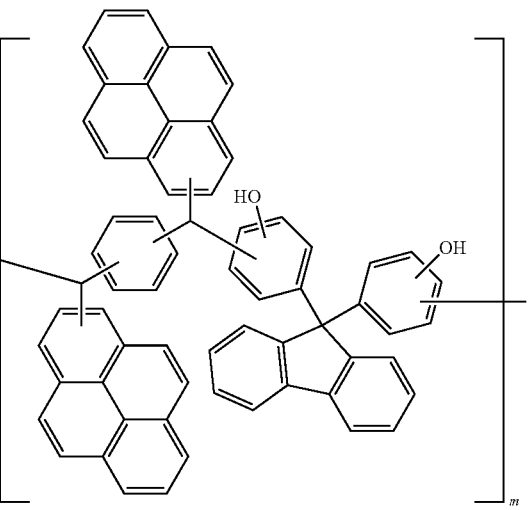
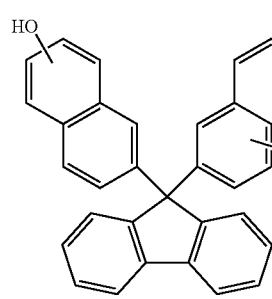 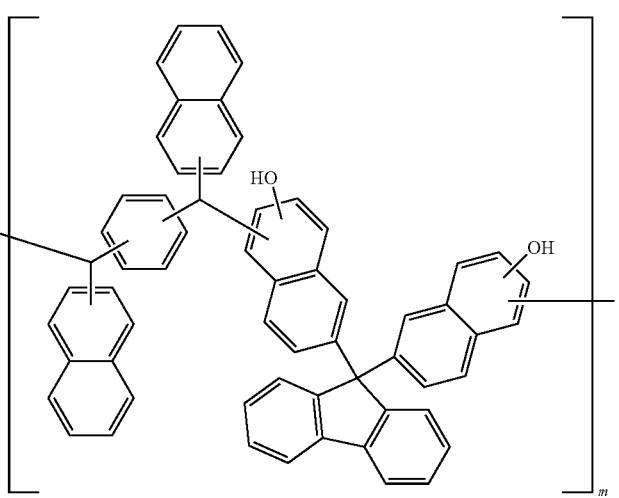

-continued
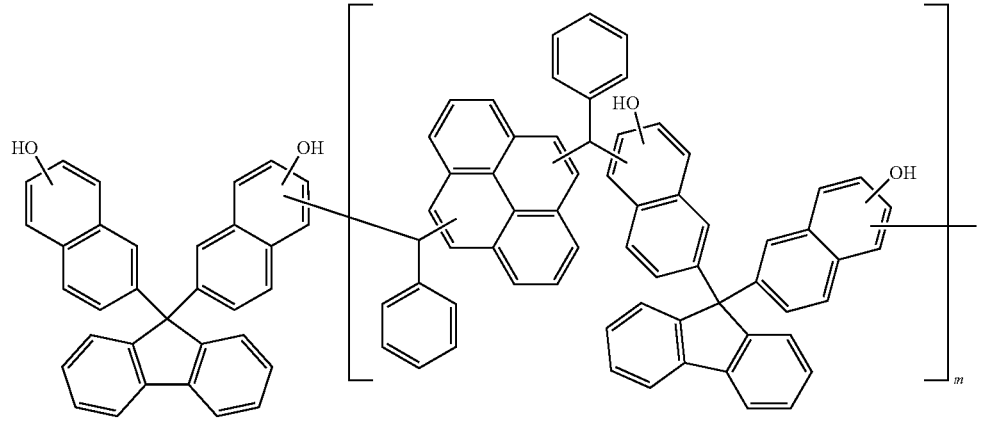
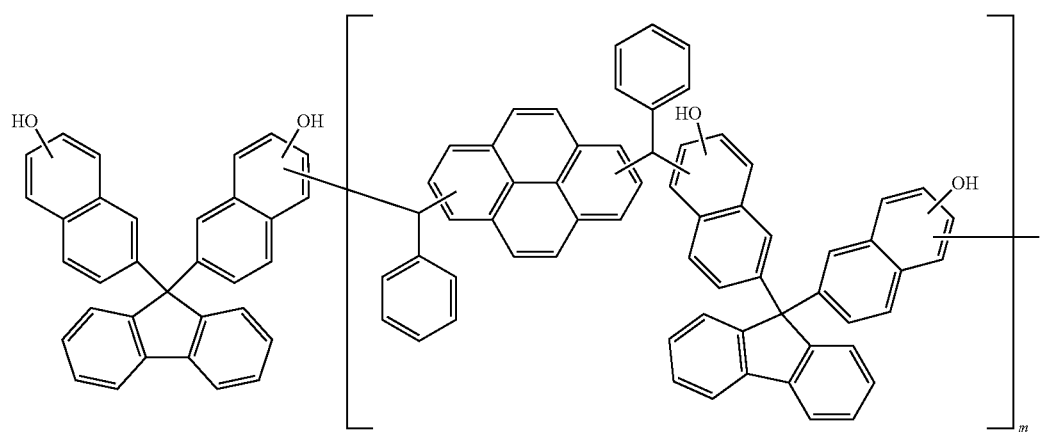
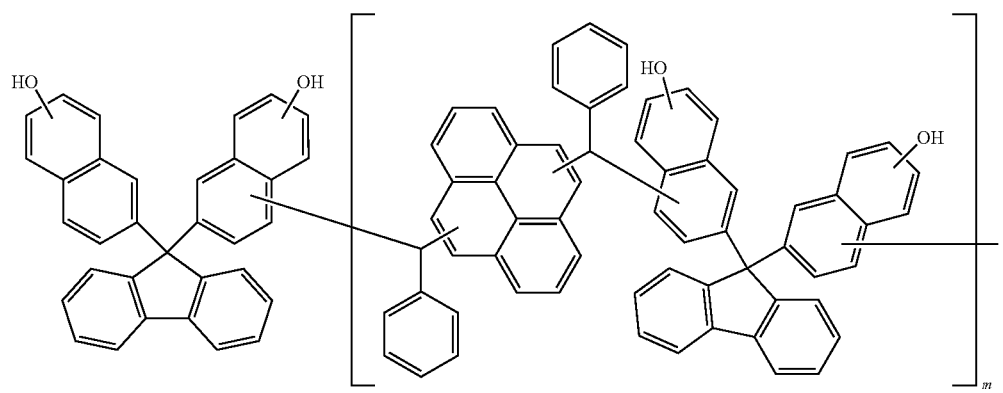
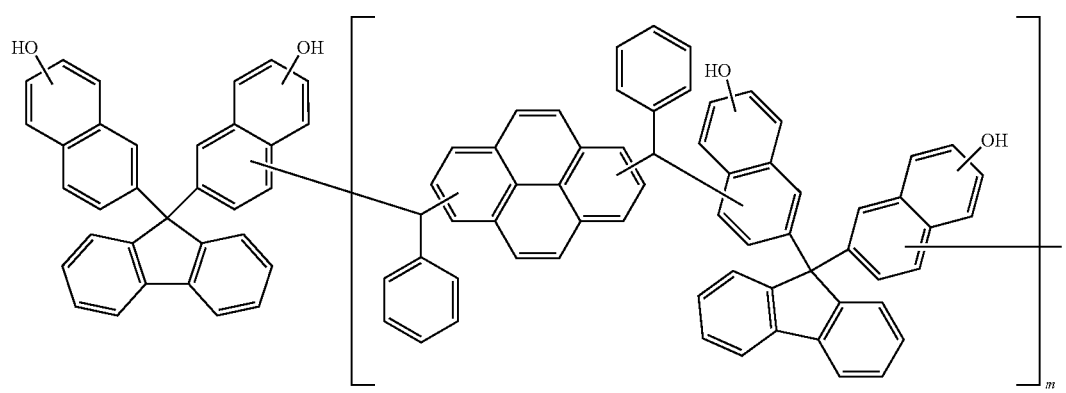

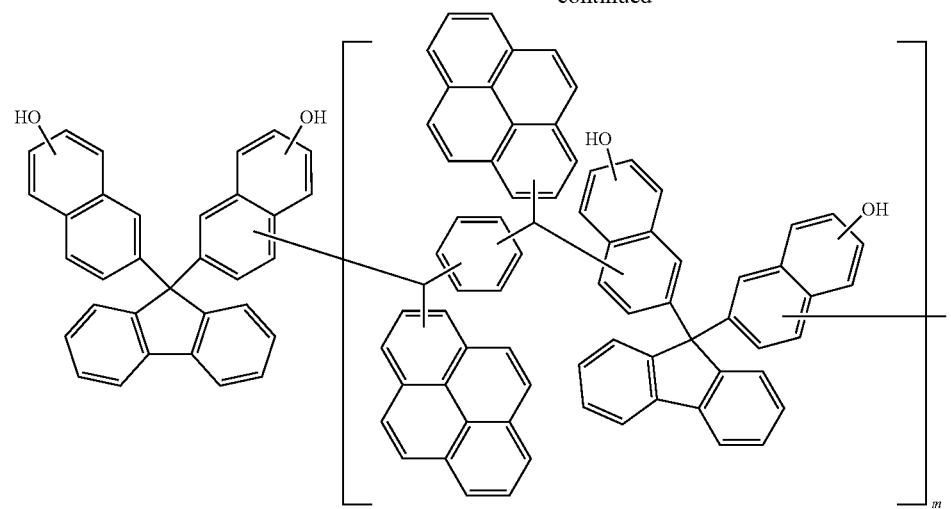
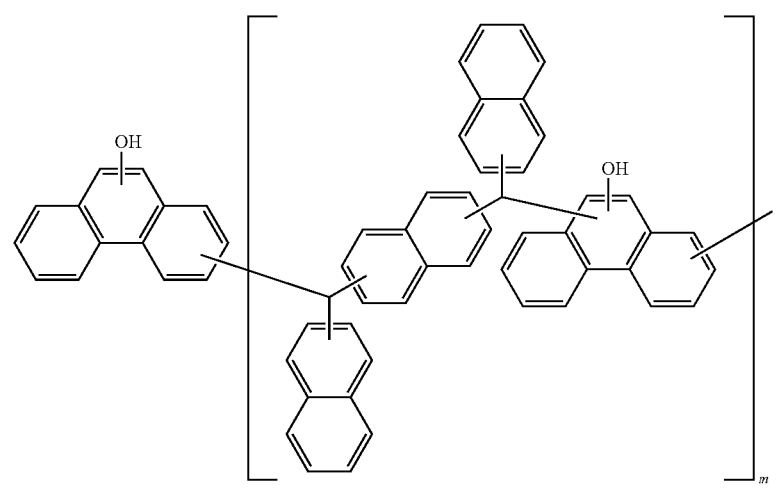
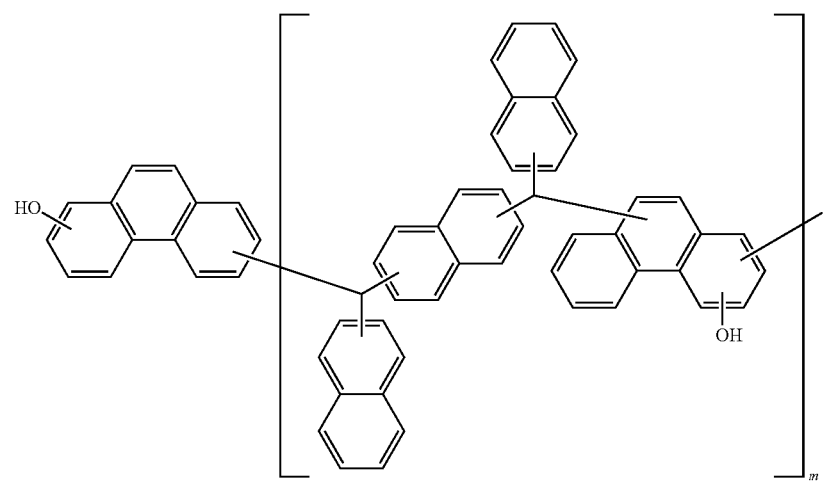

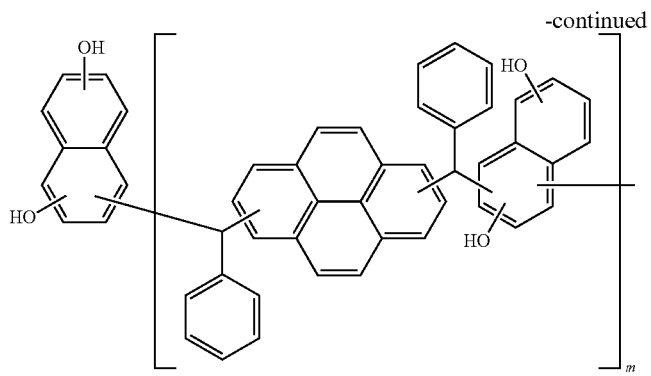

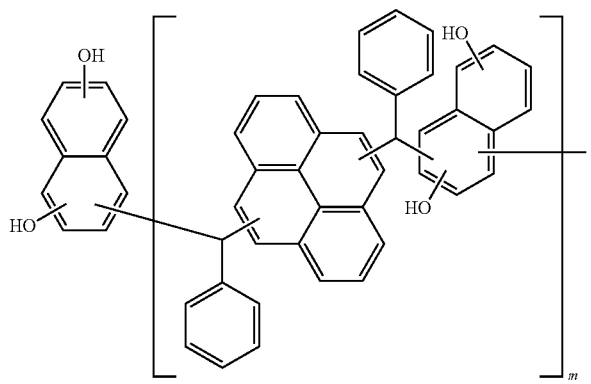

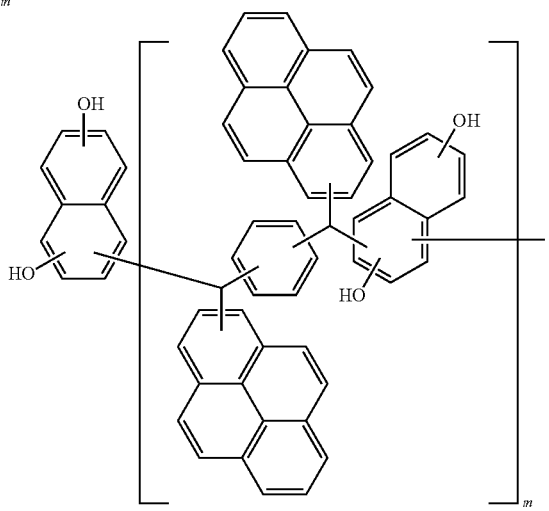

wherein m is an integer of 1 to 30.

In the above structure, the bonding position is selected from the carbon atoms of the aromatic ring, and not limited thereto.

In an exemplary embodiment of the present disclosure, the polymer according to the present disclosure may be synthesized by a known polymerization reaction, and may be prepared by polymerizing a monomer of the following Chemical Formula A and a monomer of the following Chemical Formula B, but not limited thereto:

[Chemical Formula A]

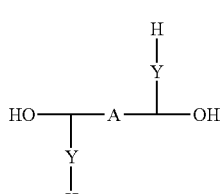

[Chemical Formula B]

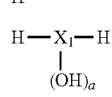

wherein Y, A, $X_1$ and a are as defined in the above Chemical Formula 1.

In addition, the present disclosure provides a resist underlayer film composition including the polymer including the repeating unit represented by Chemical Formula 1 above, wherein the underlayer film composition of the present disclosure may be used as a hard mask in a semiconductor multilayer lithography process.

In an exemplary embodiment of the present disclosure, the resist underlayer composition of the present disclosure may form an underlayer film on the substrate such as a silicon wafer, etc., by spin-coating, spin on carbon methods, etc., and may include the polymer including the repeating unit represented by Chemical Formula 1, thereby having excellent etching resistance, thermal stability, coating uniformity, surface planarization, uniformity of pattern edges, and mechanical properties of patterns, which is applicable to a hard mask process or a planarization process of a wafer surface.

In an exemplary embodiment of the present disclosure, the resist underlayer film composition of the present disclosure includes: the polymer including the repeating unit represented by Chemical Formula 1; and an organic solvent.

In an exemplary embodiment of the present disclosure, the polymer including the repeating unit of Chemical Formula 1 may be a polymer including a repeating unit of the above Chemical Formula 2 or 3.

In an exemplary embodiment of the present disclosure, the polymer for preparing the resist underlayer film may have an amount of 0.5 to 50 wt %, preferably, 1 to 30 wt %, and more preferably, 2 to 20 wt %, based on total amount of the resist underlayer film composition. When the polymer for preparing the resist underlayer film is used within the above-described range, solubility of the resist underlayer film composition and coating property at the time of forming a film may be excellent. When the amount of the polymer for preparing the resist underlayer film is less than 0.5 wt %, an underlayer film having a desired thickness may not be formed, and when the amount of the polymer for preparing the resist underlayer film is more than 50 wt %, the underlayer film may not be uniformly formed.

In an exemplary embodiment of the present disclosure, the resist underlayer composition of the present disclosure may further include at least one additive selected from crosslinking agents, acid catalysts, acid generators, antifoaming agents, and surfactants.

The polymer including the repeating unit of the Chemical Formula 1 according to the present disclosure may be dissolved in the organic solvent to be coated on the wafer, and then, a crosslinking reaction may be performed at a high temperature by itself. However, the crosslinking reaction is generally performed by adding a crosslinking agent and a catalyst. The composition obtained after the polymer for preparing the resist underlayer film, the crosslinking agent, and the acid catalyst are dissolved in a solvent, is subjected to a filtration process so that particulate impurities are completely removed.

In an exemplary embodiment of the present disclosure, the organic solvent to be usable may be any organic solvent as long as the polymer for preparing the resist underlayer film including the repeating unit represented by Chemical Formula 1, the crosslinking agent, and the acid catalyst or the acid generator are easily dissolved therein. The organic solvent is an organic solvent generally used for a manufacturing process of a semiconductor, and may include cyclohexanone, 2-heptanone, propyleneglycol monomethyl ether, propyleneglycol monomethyl acetate, propyleneglycol monomethyl ether acetate, gamma-butyrolactone, ethyl lactate, dimethylsulfoxide, dimethylacetamide, N-methylpyrrolidone, etc.

In an exemplary embodiment of the present disclosure, the crosslinking agent is to induce the crosslinking reaction to better cure the underlayer film. The crosslinking agent usable in the resist underlayer film composition of the present disclosure is not limited, and for example, at least one selected from compounds represented by Chemical Formulas 4-1 to 4-7 below:

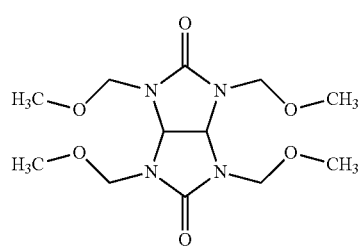

[Chemical Formula 4-1]

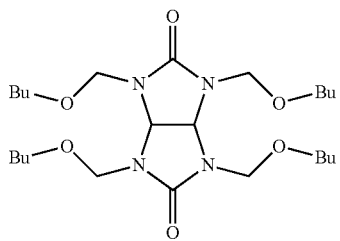

[Chemical Formula 4-2]

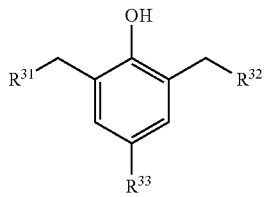

[Chemical Formula 4-3]

wherein $R^{31}$ and $R^{32}$ are independently of each other hydroxy or C1-C3 alkoxy; and $R^{33}$ is a C1-C10 alkyl,

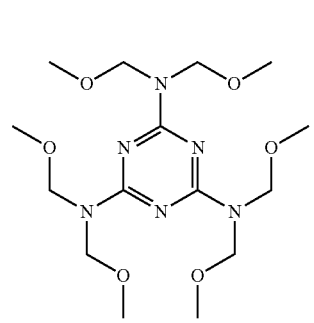

[Chemical Formula 4-4]

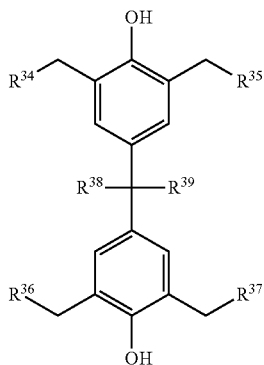

[Chemical Formula 4-5]

wherein $R^{34}$ to $R^{37}$ are independently of each other hydroxy or C1-C3 alkoxy; and $R^{38}$ and $R^{39}$ are independently of each other hydrogen, C1-C10 alkyl or halo C1-C10 alkyl,

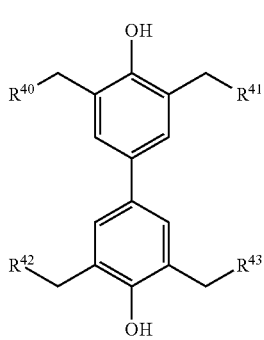

[Chemical Formula 4-6]

wherein $R^{40}$ to $R^{43}$ are independently of one another hydroxy or C1-C3 alkoxy,

[Chemical Formula 4-7]
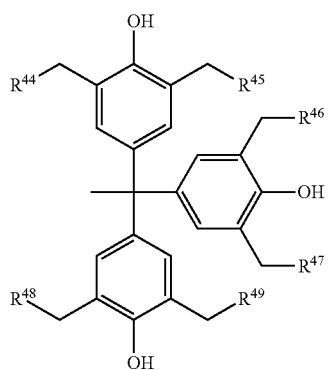
wherein $R^{44}$ to $R^{49}$ are independently of one another hydroxy or C1-C3 alkoxy.
In an exemplary embodiment of the present disclosure, the crosslinking agent to be usable in the present disclosure may be specifically exemplified by the following structures:
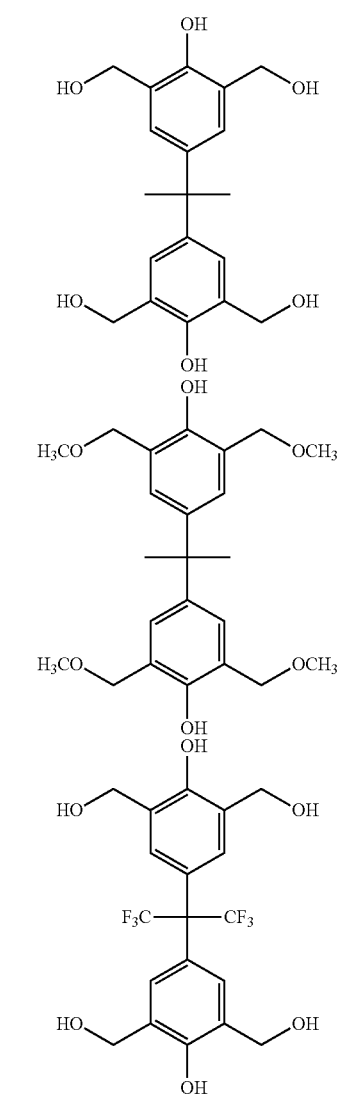
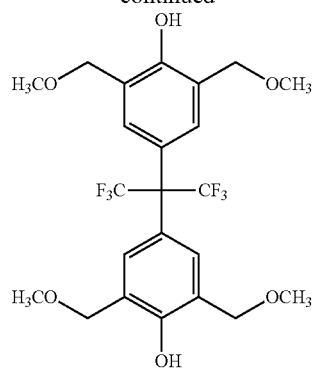
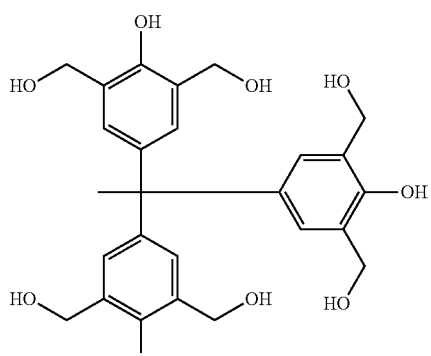
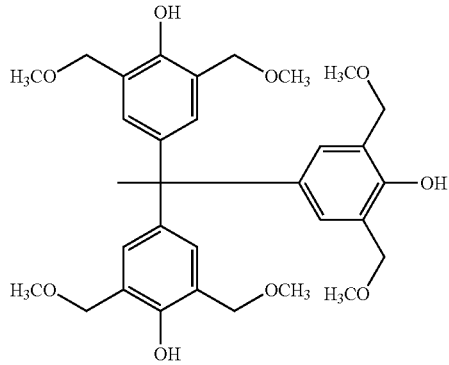
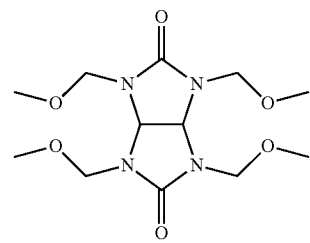
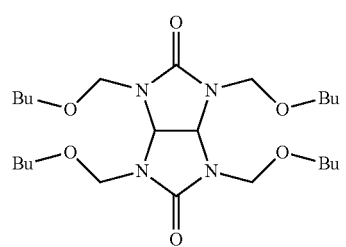

-continued

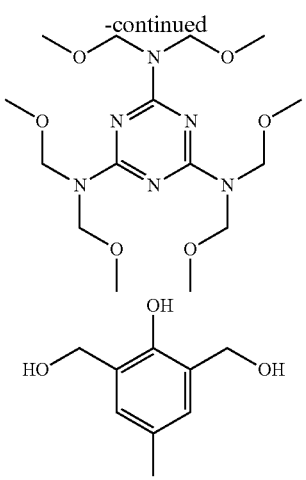

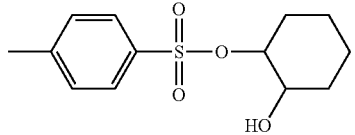
[Chemical Formula 5-4]

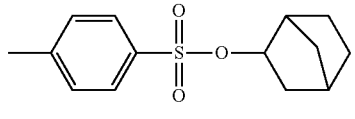
[Chemical Formula 5-5]

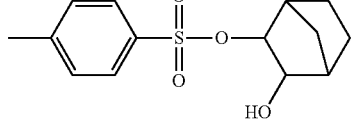
[Chemical Formula 5-6]

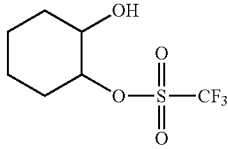
[Chemical Formula 5-7]

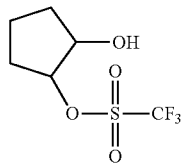
[Chemical Formula 5-8]

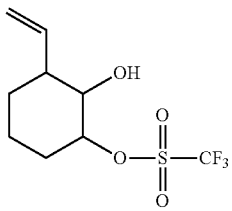
[Chemical Formula 5-9]

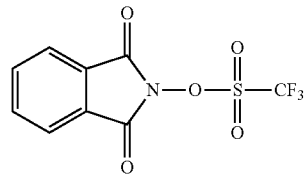
[Chemical Formula 5-10]

In an exemplary embodiment of the present disclosure, a used amount of the crosslinking agent may be slightly different depending on kinds of crosslinking agents, but the amount of the crosslinking agent may be 0.1 to 30 parts by weight, preferably, 0.1 to 20 parts by weight, and more preferably, 0.5 to 10 parts by weight, based on 100 parts by weight of the polymer including the repeating unit represented by Chemical Formula 1 of the present disclosure. When the amount of the crosslinking agent is excessively small, crosslinking is not sufficiently performed, such that the crosslinking agent is dissolved in a solvent during a process of coating organic materials at an upper part. When the amount of the crosslinking agent is excessively large, the crosslinking agent remains after the crosslinking, such that fume largely occurs, whereby stability of the resist may be decreased.

In an exemplary embodiment of the present disclosure, in order to increase a Crosslinking speed in the crosslinking process, a crosslinking catalyst may be used. As the crosslinking catalyst, an acid catalyst or an acid generator more advantageously acts than a base catalyst. The acid generator generates acid by pyrolysis, but may also generate acid by light irradiation.

In an exemplary embodiment of the present disclosure, the acid catalyst or the acid generator is added to reduce a temperature of the crosslinking reaction of the polymer and improve a crosslinking rate. The acid catalyst or the acid generator usable in the present disclosure is not limited, but for example, may be at least one selected from compounds represented by Chemical Formulas 5-1 to 5-10 below:

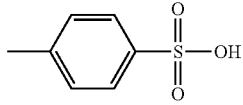
[Chemical Formula 5-1]

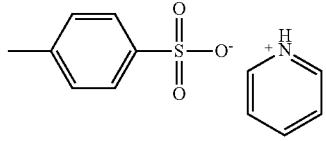
[Chemical Formula 5-2]

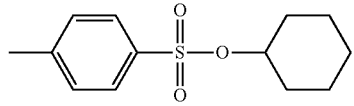
[Chemical Formula 5-3]

The acid catalyst may be divided into strong acids such as toluenesulfonic acid, and potential acid generators that are decomposed by heat to generate acid. In preparing the composition, it is preferred to use the potential acid generators rather than using the strong acids such as toluenesulfonic acid in view of storage stability. When the strong acids are used, storage stability of the resist underlayer film composition is decreased. A used amount of the acid catalyst or the acid generator may be 0.01 to 10 parts by weight, preferably, 0.05 to 5 parts by weight, and more preferably, 0.1 to 5 parts by weight, based on 100 parts by weight of the polymer including the repeating unit represented by Chemical Formula 1. When the amount thereof is excessively small, a curing speed is slow. On the contrary, when the amount thereof is excessively large, physical properties of a cured product may be decreased. In particular, when strength of the acid is large or great, fume largely occurs.

In an exemplary embodiment of the present disclosure, the surfactant may be used for improving coating uniformity when forming the resist underlayer film, and for example, commercially available surfactants, Surfynol series from Air Products, F-series (F-410, F-444, F-477, R-08, R-30, etc.) from DIC, and the like may be used. When the surfactant is used, the surfactant may have a content of 0.1 to 1 part by weight, preferably 0.2 to 0.8 parts by weight, based on 100 parts by weight of the total content of the resist underlayer film composition. When the content of the surfactant is more than 1 part by weight, based on 100 parts by weight of the total resist underlayer film composition, resist film quality may be poor. The resist underlayer film composition according to the present disclosure may be prepared by blending the above components according to general methods.

The underlayer film composition according to the present disclosure has a film-forming property in which the film is capable of being formed by general spin-coating.

In addition, the present disclosure provides a method for forming a resist underlayer film using the resist underlayer film composition. Specifically, the method for forming the resist underlayer film may include: applying the resist underlayer film composition on a substrate; and forming a resist underlayer film by heating the substrate (wafer) to which the resist underlayer film composition is applied.

In an exemplary embodiment of the present disclosure, the resist underlayer film composition is applied on the substrate in a spin-coating manner, wherein a coating thickness thereof is not specifically limited, but the resist underlayer film composition may be spin-coated at a thickness of 50 to 20,000 Å on the substrate. In addition, the resist underlayer film may be formed on the substrate by heating at a heating temperature of 200 to 450° C., preferably, 300 to 400° C. for 30 seconds to 5 minutes. After the heating process is finished, the substrate is used for a next process. In addition, the coating process, the thickness of the underlayer film, the heating temperature and time are not limited to the above-described ranges, but may vary to prepare various resist underlayer films that are different from each other depending on purposes.

The resist underlayer film composition of the present disclosure includes the polymer for preparing the resist underlayer film including the repeating unit represented by Chemical Formula 1, thereby having excellent etching resistance, thermal stability, coating uniformity, surface planarization, uniformity of pattern edges, and mechanical properties of patterns, which is applicable to a hard mask process or a planarization process of a wafer surface. Further, the resist underlayer film composition of the present disclosure has high solubility to organic solvents even though the polymer for preparing the resist underlayer film having the repeating unit represented by Chemical Formula 1 has high carbon content, thereby achieving remarkably improved storage stability and line compatibility in a semiconductor process.

Further, the present disclosure provides a method for manufacturing a semiconductor device using the resist underlayer film composition. Specifically, the method for manufacturing a semiconductor device includes: a) forming a resist underlayer film by applying and heating the resist underlayer film composition as described above on a substrate; b) forming a photoresist film on the resist underlayer film of step a); c) forming photoresist patterns by exposing and developing the substrate to which the resist underlayer film and the photoresist film of step b) are applied; d) etching the resist underlayer film by using the photoresist patterns of step c) as an etching mask to thereby expose the substrate in a form of the patterns; and e) etching the exposed portion of the substrate.

In an exemplary embodiment of the present disclosure, the substrate is commonly available, and may be a silicon wafer, a glass substrate or a polymer substrate.

In an exemplary embodiment of the present disclosure, before step b) above, a conventional silicon-containing resist underlayer film (inorganic underlayer film) or a bottom anti-reflective coating (BARC) film may be further formed on the resist underlayer film of step a). The silicon-containing resist underlayer film (inorganic underlayer film) may be formed of, for example, silicon nitride, silicon oxide or silicon oxide nitride (SiON). In addition, the method for forming patterns of the present disclosure may further include forming a bottom anti-reflective coating (BARC) film on the silicon-containing resist underlayer film.

In an exemplary embodiment of the present disclosure, the substrate may be heated before and/or after light exposure, respectively, during forming a photoresist pattern in step c), and the light exposure may be performed using one or more selected from the group consisting of far-ultraviolet rays (DUV; deep ultra violet) including ArF, KrF, and EUV, electron beam, X-ray, and ion beam. In addition, the forming of the photoresist patterns of step c) may be performed by development using a common alkaline aqueous solutions such as a tetramethylammonium hydroxide (TMAH) developer, etc., and the removing of the underlayer film of step d) may be performed by drying etching using $CHF_3/CF_4$ mixed gas and the like, and the etching of the substrate in step e) may be performed by plasma etching using $Cl_2$ or HBr gas. Here, the etching method and the like are not limited to the above, and may be variously modified depending on process conditions.

The resist underlayer film formed according to the present disclosure is formed by the polymer having the repeating unit of Chemical Formula 1 having excellent thermal stability, etching resistance and coating uniformity, and has excellent thermal stability, etching resistance and coating uniformity. In addition, in spite of a high carbon content of the polymer, the resist underlayer film has excellent solubility in an organic solvent, thereby having significantly improved storage stability and line compatibility in a semiconductor process.

Hereinafter, the present invention will be described in more detail with reference to the specific Examples and Comparative Examples. However, the following Examples are only illustrative of the present invention, and do not limit the present invention in any way.

[Example 1] Preparation of Monomer (I)

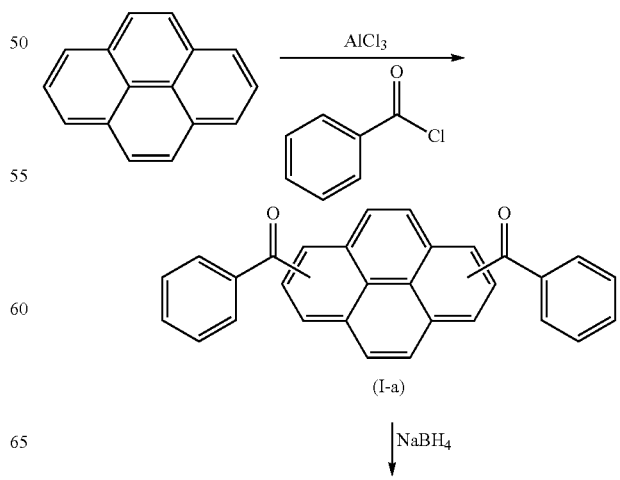

(I-a)

↓ $NaBH_4$

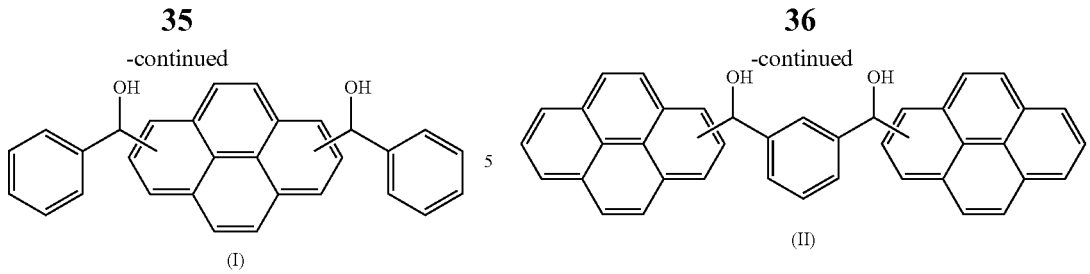

Step 1: Preparation of pyrene-diylbis(phenylmethanone) (compound I-a)

Aluminum chloride (33.46 g, 0.25 mol) and 126 g of dichloromethane were added to a flask, and stirred for 30 minutes. A solution of a mixture of benzoyl chloride (35.22 g, 0.25 mol) and pyrene (20.30 g, 0.10 mol) with 126 g of dichloromethane was slowly added to the solution, and stirred for 12 hours. When the reaction was completed, methanol was slowly added, and then the solution was cooled to form a precipitate which was filtered to obtain 42.50 g of pyrene-diylbis(phenylmethanone) (compound I-a). $^1$H-NMR (500 MHz, CDCl$_3$) 8.4-8.5 (2H), 8.2-8.3 (2H), 8.2-8.1 (4H), 7.8-8.0 (4H), 7.6-7.7 (2H), 7.4-7.5 (4H).

Step 2: Preparation of pyrene-diylbis(phenylmethanol) (monomer I)

Pyrene-diylbis(phenylmethanone) (compound I-a) (38.00 g, 0.09 mol), 110 g of tetrahydrofuran and 110 g of methanol were added to a flask, and stirred. Sodium borohydride (12.30 g, 0.32 mol) was slowly added to the solution, and then stirred for 2 hours. When the reaction was completed, a 1 M hydrogen chloride solution was slowly added to form a precipitate which was filtered to obtain 34.85 g of pyrene-diylbis(phenylmethanol) (monomer I). $^1$H-NMR (DMSO-d$_6$) δ 8.5 (2H), 8.2 (4H), 8.1 (2H), 7.4 (4H), 7.3 (4H), 7.2 (2H), 6.7 (2H), 6.3 (2H).

[Example 2] Preparation of Monomer (II)

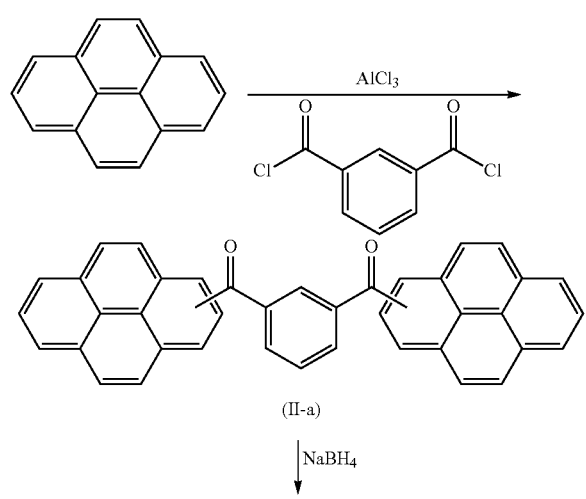

Step 1: Preparation of 1,3-phenylenebis(pyrenylmethanone) (compound II-a)

Aluminum chloride (27.35 g, 0.21 mol) and 265 g of dichloromethane were added to a flask, and stirred for 30 minutes. A solution of a mixture of isophthaloyl chloride (20.31 g, 0.10 mol) and pyrene (42.49 g, 0.21 mol) with 265 g of dichloromethane was slowly added to the solution, and stirred for 2 hours. When the reaction was completed, ethanol was slowly added to form a precipitate which was filtered to obtain 45.60 g of 1,3-phenylenebis(pyrenylmethanone) (compound II-a). $^1$H-NMR (DMSO-d$_6$) δ 8.5-8.4 (4H), 8.4-8.2 (8H), 8.2-8.1 (9H), 7.8 (1H)

Step 2: Preparation of 1,3-phenylenebis(pyrenylmethanol) (monomer II)

1,3-phenylenebis(pyrenylmethanone) (compound II-a) (45.55 g, 0.09 mol), 220 g of tetrahydrofuran and 22 g of methanol were added to a flask, and stirred. Sodium borohydride (2.63 g, 0.07 mol) was slowly added to the solution, and then stirred for 2 hours. When the reaction was completed, a 1M hydrogen chloride solution was slowly added to form a precipitate which was filtered to obtain 44.35 g of 1,3-phenylenebis(pyrenylmethanol) (monomer II). $^1$H-NMR (DMSO-d$_6$) δ 8.3 (2H), 8.1 (6H), 8.0 (6H), 7.8 (2H), 7.6 (1H), 7.1 (3H), 6.6 (2H), 6.2 (2H)

[Example 3] Preparation of Polymer (1)

Pyrene-diylbis(phenylmethanol) (monomer I) (6.22 g, 0.015 mol) obtained in Example 1, 1-naphthol (3.89 g, 0.027 mol), and 23.6 g of dimethylformamide were added to a flask, and heated to an internal temperature of 120° C. and stirred. p-Toluenesulfonic monohydrate (0.17 g, 0.001 mol) diluted with dimethylformamide to 40 wt % was added, and stirred for 6 hours. The reactant was extracted with dichloromethane, neutralized with pyridine, subjected to a purification process with a 5 wt % aqueous hydrochloric acid solution and distilled water, and added dropwise to heptane with vigorous stirring, thereby obtaining pink powder. The obtained powder was filtered and then vacuum dried at 60° C. to obtain 7.87 g of polymer (1). As result of analyzing the dried polymer (1) with GPC, the weight average molecular weight in terms of polystyrene was 865 g/mol.

[Example 4] Preparation of Polymer (2)

Pyrene-diylbis(phenylmethanol) (monomer I) (6.22 g, 0.015 mol) obtained in Example 1, 1-hydroxypyrene (5.89 g, 0.027 mol), and 28.3 g of dimethylformamide were added to a flask, and heated to an internal temperature of 120° C. and stirred. p-Toluenesulfonic monohydrate (0.52 g, 0.003 mol) diluted with dimethylformamide to 40 wt % was added, and stirred for 12 hours. The reactant was extracted with dichloromethane, neutralized with pyridine, subjected to a purification process with a 5 wt % aqueous hydrochloric acid solution and distilled water, and added dropwise to heptane, thereby obtaining brown powder. The obtained powder was filtered and then vacuum dried at 60° C. to obtain 9.68 g of polymer (2). As result of analyzing the dried polymer (2) with GPC, the weight average molecular weight in terms of polystyrene was 868 g/mol.

[Example 5] Preparation of Polymer (3)

Pyrene-diylbis(phenylmethanol) (monomer I) (6.22 g, 0.015 mol) obtained in Example 1, 9,9-bis(6-hydroxy-2-naphthyl)fluorene) (12.16 g, 0.027 mol), and 42.9 g of dimethylformamide were added to a flask, and heated to an internal temperature of 110° C. and stirred. p-Toluenesulfonic monohydrate (0.17 g, 0.001 mol) diluted with dimethylformamide to 40 wt % was added, and stirred for 6 hours. The reactant was extracted with dichloromethane, neutralized with pyridine, subjected to a purification process with a 5 wt % aqueous hydrochloric acid solution and distilled water, and added dropwise to heptane with vigorous stirring, thereby obtaining pink powder. The obtained powder was filtered and then vacuum dried at 60° C. to obtain 14.65 g of polymer (3). As result of analyzing the dried polymer (3) with GPC, the weight average molecular weight in terms of polystyrene was 954 g/mol.

[Example 6] Preparation of Polymer (4)

Pyrene-diylbis(phenylmethanol) (monomer I) (6.22 g, 0.015 mol) obtained in Example 1, 9,9-bis(4-hydroxyphenyl)fluorene) (9.46 g, 0.027 mol), and 36.6 g of 1,2,3,4-tetrahydronaphthalene were added to a flask, and heated to an internal temperature of 110° C. and stirred. p-Toluenesulfonic monohydrate (0.17 g, 0.001 mol) diluted with 1,2,3,4-tetrahydronaphthalene to 40 wt % was added, and stirred for 6 hours. The reactant was extracted with dichloromethane, neutralized with pyridine, subjected to a purification process with a 5 wt % aqueous hydrochloric acid solution and distilled water, and added dropwise to heptane with vigorous stirring, thereby obtaining pink powder. The obtained powder was filtered and then vacuum dried at 60° C. to obtain 12.48 g of polymer (4). As result of analyzing the dried polymer (4) with GPC, the weight average molecular weight in terms of polystyrene was 975 g/mol.

[Example 7] Preparation of Polymer (5)

Pyrene-diylbis(phenylmethanol) (monomer I) (6.22 g, 0.015 mol) obtained in Example 1, 1,5-naphthalenediol (4.34 g, 0.027 mol), and 24.6 g of 1,2,3,4-tetrahydronaphthalene were added to a flask, and heated to an internal temperature of 110° C. and stirred. p-Toluenesulfonic monohydrate (0.17 g, 0.001 mol) diluted with 1,2,3,4-tetrahydronaphthalene to 40 wt % was added, and stirred for 1 hour. The reactant was extracted with dichloromethane, neutralized with pyridine, subjected to a purification process with a 5 wt % aqueous hydrochloric acid solution and distilled water, and added dropwise to heptane with vigorous stirring, thereby obtaining pink powder. The obtained powder was filtered and then vacuum dried at 60° C. to obtain 8.32 g of polymer (5). As result of analyzing the dried polymer (5) with GPC, the weight average molecular weight in terms of polystyrene was 5,572 g/mol.

[Example 8] Preparation of Polymer (6)

1,3-Phenylenebis(pyrenylmethanol) (monomer II) (8.08 g, 0.015 mol) obtained in Example 2, 1-naphthol (3.89 g, 0.027 mol), and 27.9 g of 1,2,3,4-tetrahydronaphthalene were added to a flask, and heated to an internal temperature of 110° C. and stirred. p-Toluenesulfonic monohydrate (0.17 g, 0.001 mol) diluted with 1,2,3,4-tetrahydronaphthalene to 40 wt % was added, and stirred for 6 hours. The reactant was extracted with dichloromethane, neutralized with pyridine, subjected to a purification process with a 5 wt % aqueous hydrochloric acid solution and distilled water, and added dropwise to heptane with vigorous stirring, thereby obtaining pink powder. The obtained powder was filtered and then vacuum dried at 60° C. to obtain 9.38 g of polymer (6). As result of analyzing the dried polymer (6) with GPC, the weight average molecular weight in terms of polystyrene was 972 g/mol.

[Example 9] Preparation of Polymer (7)

1,3-Phenylenebis(pyrenylmethanol) (monomer II) (8.08 g, 0.015 mol) obtained in Example 2, 1-hydroxypyrene (5.89 g, 0.027 mol), and 32.6 g of dimethylformamide were added to a flask, and heated to an internal temperature of 120° C. and stirred. p-Toluenesulfonic monohydrate (0.52 g, 0.003 mol) diluted with dimethylformamide to 40 wt % was added, and stirred for 12 hours. The reactant was extracted with dichloromethane, neutralized with pyridine, subjected to a purification process with a 5 wt % aqueous hydrochloric acid solution and distilled water, and added dropwise to heptane, thereby obtaining brown powder. The obtained powder was filtered and then vacuum dried at 60° C. to obtain 10.87 g of polymer (7). As result of analyzing the dried polymer (7) with GPC, the weight average molecular weight in terms of polystyrene was 954 g/mol.

[Example 10] Preparation of Polymer (8)

1,3-Phenylenebis(pyrenylmethanol) (monomer II) (8.08 g, 0.015 mol) obtained in Example 2, 9,9-bis(6-hydroxy-2-naphthyl)fluorene) (12.16 g, 0.027 mol), and 47.2 g of dimethylformamide were added to a flask, and heated to an internal temperature of 110° C. and stirred. p-Toluenesulfonic monohydrate (0.17 g, 0.001 mol) diluted with dimethylformamide to 40 wt % was added, and stirred for 6 hours. The reactant was extracted with dichloromethane, neutralized with pyridine, subjected to a purification process with a 5 wt % aqueous hydrochloric acid solution and distilled water, and added dropwise to heptane with vigorous stirring, thereby obtaining pink powder. The obtained powder was filtered and then vacuum dried at 60° C. to obtain 15.55 g of polymer (8). As result of analyzing the dried polymer (8) with GPC, the weight average molecular weight in terms of polystyrene was 1,041 g/mol.

[Example 11] Preparation of Polymer (9)

1,3-Phenylenebis(pyrenylmethanol) (monomer II) (8.08 g, 0.015 mol) obtained in Example 2, 9,9-bis(4-hydroxyphenyl)fluorene) (9.46 g, 0.027 mol), and 40.9 g of 1,2,3,4-tetrahydronaphthalene were added to a flask, and heated to an internal temperature of 110° C. and stirred. p-Toluenesulfonic monohydrate (0.17 g, 0.001 mol) diluted with 1,2,3,4-tetrahydronaphthalene to 40 wt % was added, and stirred for 6 hours. The reactant was extracted with dichloromethane, neutralized with pyridine, subjected to a purification process with a 5 wt % aqueous hydrochloric acid solution and distilled water, and added dropwise to heptane with vigorous stirring, thereby obtaining pink powder. The obtained powder was filtered and then vacuum dried at 60°

C. to obtain 13.78 g of polymer (9). As result of analyzing the dried polymer (9) with GPC, the weight average molecular weight in terms of polystyrene was 1,036 g/mol.

[Example 12] Preparation of Polymer (10)

1,3-Phenylenebis(pyrenylmethanol) (monomer II) (8.08 g, 0.015 mol) obtained in Example 2, 1,5-naphthalenediol) (4.34 g, 0.027 mol), and 28.9 g of 1,2,3,4-tetrahydronaphthalene were added to a flask, and heated to an internal temperature of 110° C. and stirred. p-Toluenesulfonic monohydrate (0.17 g, 0.001 mol) diluted with 1,2,3,4-tetrahydronaphthalene to 40 wt % was added, and stirred for 1 hour. The reactant was extracted with dichloromethane, neutralized with pyridine, subjected to a purification process with a 5 wt % aqueous hydrochloric acid solution and distilled water, and added dropwise to heptane with vigorous stirring, thereby obtaining pink powder. The obtained powder was filtered and then vacuum dried at 60° C. to obtain 9.75 g of polymer (10). As result of analyzing the dried polymer (10) with GPC, the weight average molecular weight in terms of polystyrene was 5,648 g/mol.

[Comparative Example 1] Preparation of Comparative Polymer (A)

Hydroxy(2-naphthalenyl)methylpyrenol) (26.2 g, 0.07 mol), p-Toluenesulfonic acid monohydrate (0.027 g, 0.14 mmol) and 60.8 g of 1,2,3,4-tetrahydronaphthalene were added to a flask, and then stirred for 12 hours under the condition of 120° C. After the polymerization reaction was completed, the reactant was cooled to room temperature, extracted with dichloromethane, neutralized with pyridine, subjected to a purification process with a 5 wt % hydrochloric acid solution and distilled water, and added dropwise to a mixed solution of methanol and heptane at a mass ratio of 0.5:9.5 to obtain a precipitate. The obtained precipitate was filtered and then vacuum dried at 60° C. to obtain 18.8 g of comparative polymer (A). As result of analyzing the dried comparative polymer (A) with GPC, the weight average molecular weight in terms of polystyrene was 2700 g/mol.

[Comparative Example 2] Preparation of Comparative Polymer (B)

Benzaldehyde (2.7 g, 0.026 mol), 1-hydroxypyrene (11.1 g, 0.051 mol), 52.8 g of dimethylformamide, and 35.3 g of toluene were added to a flask, and heated to an internal temperature of 120° C. and stirred. p-Toluenesulfonic monohydrate (0.3 g, 0.003 mol) (0.027 g, 0.14 mmol) was added, and then stirred for 4 hours. The reactant was extracted with dichloromethane, neutralized with pyridine, subjected to a purification process with a 5 wt % aqueous hydrochloric acid solution and distilled water, and added dropwise to heptane with vigorous stirring thereby obtaining tan powder. The obtained powder was filtered and then vacuum dried at 60° C. to obtain 9.3 g of comparative polymer (B). As result of analyzing the dried comparative polymer (B) with GPC, the weight average molecular weight in terms of polystyrene was 2,180 g/mol.

In order to examine the solubility of the polymers prepared in Examples 3 to 12, and Comparative Examples 1 and 2, each of the polymers was dissolved in various solvents, propylene glycol methyl ether acetate (PGMEA), propylene glycol methyl ether (PGME), ethyl 3-ethoxypropionate (EEP) and a mixed solvent of PGMEA/PGME (volume ratio of 3/7) to 20 wt %, and the transparency of each solution was evaluated as ⊚: very good, ○: good, Δ: moderate, x: not good. The results are shown in the following Table 1.

TABLE 1

| Polymer | | Solubility |
|---|---|---|
| Example 3 | Polymer 1 | ⊚ |
| Example 4 | Polymer 2 | ○ |
| Example 5 | Polymer 3 | ○ |
| Example 6 | Polymer 4 | ○ |
| Example 7 | Polymer 5 | ○ |
| Example 8 | Polymer 6 | ⊚ |
| Example 9 | Polymer 7 | ○ |
| Example 10 | Polymer 8 | ○ |
| Example 11 | Polymer 9 | ○ |
| Example 12 | Polymer 10 | ○ |
| Comparative Example 1 | Comparative Polymer A | Δ |
| Comparative Example 2 | Comparative Polymer B | Δ |

[Examples 13 to 22, and Comparative Examples 3 and 4] Preparation of Resist Underlayer Film Composition According to the composition described in the following Table 2, a polymer, a crosslinking agent and an acid catalyst were dissolved in a solvent (50 g), and filtered through a 0.05 μm filter, thereby preparing a resist underlayer film composition from which particulate impurities were completely removed.

As the crosslinking agent, 1,3,4,6-tetrakis(methoxymethyl)glycoluril was used, and as the acid catalyst, pyridinium p-toluenesulfonate was used. As the solvent, a mixed solvent of propylene glycol monomethyl ether acetate (PGMEA) and cyclohexanone at a volume ratio of 8:2 was used.

TABLE 2

| Resist underlayer film composition | Polymer | | Crosslinking agent | Catalyst |
|---|---|---|---|---|
| | Type | Used amount | | |
| Example 13 | Polymer 1 | 10.0 g | 0.2 g | 0.01 g |
| Example 14 | Polymer 2 | 10.0 g | 0.2 g | 0.01 g |
| Example 15 | Polymer 3 | 10.0 g | 0.2 g | 0.01 g |
| Example 16 | Polymer 4 | 10.0 g | 0.2 g | 0.01 g |
| Example 17 | Polymer 5 | 10.0 g | 0.2 g | 0.01 g |
| Example 18 | Polymer 6 | 10.0 g | 0.2 g | 0.01 g |
| Example 19 | Polymer 7 | 10.0 g | 0.2 g | 0.01 g |
| Example 20 | Polymer 8 | 10.0 g | 0.2 g | 0.01 g |
| Example 21 | Polymer 9 | 10.0 g | 0.2 g | 0.01 g |
| Example 22 | Polymer 10 | 10.0 g | 0.2 g | 0.01 g |
| Comparative Example 3 | Comparative Polymer A | 10.0 g | 0.2 g | 0.01 g |
| Comparative Example 4 | Comparative Polymer B | 10.0 g | 0.2 g | 0.01 g |

[Experimental Example 1] Manufacture and Evaluation of Resist Underlayer Film

Each of the underlayer film compositions of Examples 13 to 22, and Comparative Examples 3 and 4 was spin coated on a silicon wafer, and then heated at 240° C. for 60 seconds, and at 400° C. for 120 seconds to form a resist underlayer film having a thickness of 4500 Å.

The surface of the resist underlayer film formed on the silicon wafer was observed with the naked eye or using a scanning electron microscope (SEM) or the like. Through surface observation, a degree of crosslinking, surface uniformity, existence of cracks, and etching resistance were evaluated as ⊚: very good, ○: good, Δ: moderate, x: not good. The results are shown in following Table 3.

TABLE 3

| Resist underlayer film composition | Degree of crosslinking | Surface uniformity | Existence of cracks | Etching resistance |
|---|---|---|---|---|
| Example 13 | ⊚ | ○ | No | ○ |
| Example 14 | ⊚ | Δ | No | ⊚ |
| Example 15 | ○ | Δ | No | ⊚ |
| Example 16 | ○ | ○ | No | ○ |
| Example 17 | ⊚ | ○ | No | ⊚ |
| Example 18 | ⊚ | ○ | No | ⊚ |
| Example 19 | ⊚ | Δ | No | ⊚ |
| Example 20 | ○ | Δ | No | ○ |
| Example 21 | ○ | ○ | No | ○ |
| Example 22 | ⊚ | ○ | No | ⊚ |
| Comparative Example 3 | Δ | Δ | No | X |
| Comparative Example 4 | ○ | Δ | No | Δ |

Evaluation 1: Degree of Crosslinking

In order to confirm the crosslinking ability of the above-prepared resist underlayer film, after conducting the heating process, the thickness of the underlayer film was measured, a thinner solution was applied on the wafer on which the underlayer film was formed, and then the wafer was allowed to stand for 1 minute. In order to completely remove the thinner solution, the wafer was rotated at 2000 RPM to remove the thinner solution, and then the thickness of the underlayer film was measured again.

Evaluation 2: Gap-Fill Property and Planarization Property

The underlayer compositions of Examples 13 to 22, and Comparative Examples 3 and 4 were spin coated on a silicon wafer having an etched pattern, subjected to heat treatment at 240° C. for 60 seconds, and at 400° C. for 120 seconds to form an underlayer film, and then a field emission scanning electron microscope (FE-SEM) was used to observe a gap-fill property and a planarization property, and the results are shown in the following Table 4. The gap-fill property was identified by observing the pattern section with FE-SEM to confirm the existence of voids, and the planarization property was evaluated by measuring the thickness of the underlayer film from the image of the pattern section observed with FE-SEM, and digitizing the planarization by the following Calculation Formula 1. The smaller the difference between h1 and h2 is, the better the planarization property is, and thus, the smaller the value is, the better the planarization property is.

[Calculation Formula 1]

$$\text{Planarization} = \left(1 - \frac{h_2}{h_1}\right) \times 100$$

TABLE 4

| Resist underlayer film composition | Planarization property | Gap-fill property (Existence of void) |
|---|---|---|
| Example 13 | 11 | No |
| Example 14 | 13 | No |
| Example 15 | 15 | No |
| Example 16 | 14 | No |
| Example 17 | 15 | No |
| Example 18 | 16 | No |
| Example 19 | 18 | No |
| Example 20 | 14 | No |
| Example 21 | 15 | No |
| Example 22 | 17 | No |
| Comparative Example 3 | 24 | Yes |
| Comparative Example 4 | 21 | Yes |

Evaluation 3: Thermal Stability

The underlayer film compositions of Examples 13 to 22, and Comparative Examples 3 and 4 were applied on a silicon wafer by a spin-on coating method, and then subjected to heat treatment on a hot plate at 240° C. for 1 minute to form a thin film. The thickness of the thin film was measured by a thin film thickness measurement apparatus available from K-MAC. Then, the thin film was subjected to heat treatment at 400° C. for 2 minutes again, and then the thickness of the thin film was measured. The thin film thickness reduction rate is shown in the following Table 5.

TABLE 5

| Resist underlayer film composition | Thickness (Å) After heat treatment at 240° C. | Thickness (Å) After heat treatment at 400° C. | Thickness change | Thin film thickness reduction rate (%) |
|---|---|---|---|---|
| Example 13 | 3397 | 3021 | 376 | 11.07% |
| Example 14 | 3619 | 3162 | 457 | 12.62% |
| Example 15 | 3534 | 3139 | 395 | 11.17% |
| Example 16 | 3412 | 3014 | 398 | 11.66% |
| Example 17 | 3427 | 3041 | 386 | 11.26% |
| Example 18 | 3481 | 3095 | 386 | 11.08% |
| Example 19 | 3594 | 3135 | 459 | 12.78% |
| Example 20 | 3421 | 3025 | 396 | 11.57% |
| Example 21 | 3472 | 3061 | 411 | 11.84% |
| Example 22 | 3538 | 3131 | 407 | 11.49% |
| Comparative Example 3 | 3564 | 3042 | 522 | 14.65% |
| Comparative Example 4 | 3461 | 2987 | 474 | 13.70% |

Evaluation 4: Etching Resistance

The underlayer film compositions of Examples 13 to 22, and Comparative Examples 3 and 4 were applied on a silicon wafer by a spin-on coating method, and then subjected to heat treatment at 240° C. for 60 seconds, and at 400° C. for 120 seconds to form an underlayer film. Then, the thickness of the underlayer film was measured. Then, the underlayer film was dry-etched for 60 seconds using mixed gas of $N_2/O_2$ and $CF_x$ gas, respectively, and then the thickness of the underlayer film was measured again. An etch rate (bulk etch rate) was calculated by the following Calculation Formula 2, from the thickness of the underlayer film before and after dry-etching, and etching time, and the results are shown in the following Table 6.

(Initial thin film thickness−Thin film thickness after etching)/Etching time (Å/s)  [Calculation Formula 2]

TABLE 6

| Resist underlayer film composition | $N_2/O_2$ etch rate (Å/s) | $CF_x$ etch rate (Å/s) |
|---|---|---|
| Example 13 | 28.5 | 31.8 |
| Example 14 | 27.9 | 29.5 |
| Example 15 | 27.5 | 29.1 |
| Example 16 | 29.7 | 31.5 |
| Example 17 | 28.1 | 29.3 |
| Example 18 | 28.3 | 30.4 |
| Example 19 | 27.6 | 29.7 |
| Example 20 | 27.5 | 29.6 |
| Example 21 | 28.4 | 31.8 |
| Example 22 | 28.2 | 29.3 |
| Comparative Example 3 | 33.4 | 34.2 |
| Comparative Example 4 | 31.9 | 33.1 |

Evaluation 5: Storage Stability Acceleration Test

Each of the polymers prepared in Examples 3 to 12 was dissolved in various organic solvent to 10 wt %, which is identical to the above solubility-related experiment, and then allowed to stand at 50° C. for 4 weeks and the transparency of the solution was observed to perform the storage stability acceleration test.

Used organic solvents: ethyl lactate (E/L), propylene glycol methyl ether (PGME), cyclohexanone (C/H), propylene glycol methyl ether (PGME)/propylene Glycol methyl ether acetate (PGMEA): 70/30 or ethyl 3-ethoxypropionate (EEP).

It was confirmed that all of the polymers of the present invention had an excellent solubility property in a common organic solvent, and as a result of the storage stability acceleration test at 50° C., the polymers were stable without a precipitate even after 4 weeks, and thus, had sufficiently improved storage stability.

[Experiment Example 2] Formation of Pattern

Each of the underlayer film compositions of Examples 13, 14 and 15 was spin coated on a wafer, and baked at 240° C. for 60 seconds, and at 400° C. for 120 seconds to form an underlayer film having a thickness of 200 nm, and BARC was coated on the underlayer film, and baked at 230° C. for 60 seconds to form a BARC layer having a thickness of 20 nm. As the BARC, BARC having a Refractive Index(n) of 1.9 or more, for ArF immersion was used. Photoresist for ArF was coated on the underlayer film, baked at 110° C. for 60 seconds to form a photoresist layer having a thickness of 150 nm. The photoresist layer was exposed to light using an ArF excimer laser scanner (available from ASML), and baked at 110° C. for 60 seconds. Thereafter, the photoresist layer was developed with a TMAH (2.38 wt % aqueous solution) developer for 60 seconds to obtain a photoresist pattern. The underlayer film was dry-etched with $CHF_3/CF_4$ mixed gas using the thus-obtained photoresist pattern as a hard mask, and then $BCl_3/Cl_2$ mixed gas was used to perform dry etching again. Finally, $O_2$ gas was used to remove all remaining organic materials.

After the photolithography process and the etching process, each of the pattern sections was observed with FE-SEM, and it was found therefrom that excellent properties were shown in terms of a pattern shape and pattern fidelity of the hard mask layer in a vertical shape, CD uniformity, line width roughness and the like.

INDUSTRIAL APPLICABILITY

The novel polymer of the present disclosure represents excellent thermal resistance, in addition to an optimized etch selectivity and a planarization property, due to a high carbon content, and thus, the resist underlayer film composition including the polymer may form a hard mask (spin-on carbon (SOC) hard mask) by spin coating in a semiconductor multilayer lithography process, and has less occurrence of fumes in a post process heated at 400° C., thereby being useful as a high temperature SOC material.

The resist underlayer film composition of the present disclosure shows excellent etching resistance, thermal stability and coating uniformity due to the novel polymer, and in particular, in spite of a high carbon content, has excellent solubility in an organic solvent, thereby representing an effect of significantly improving storage stability and line compatibility in a semiconductor process.

In addition, the resist underlayer film formed according to the present disclosure has excellent thermal stability, and an excellent gap fill property even at the time of being applied on a wafer having a step difference, thereby having an excellent planarization degree. Further, the resist underlayer film formed according to the present disclosure has excellent etching resistance to thereby serve as a protective layer (hard mask) for forming shapes of predetermined patterns at the time of a dry-etching process, may minimize a loss of the mask as the etching speed of the resist film becomes fast or slow, and to increase an etching amount of the underlayer film.

In addition, even in the case in which the resist underlayer film formed by using the resist underlayer film composition of the present disclosure is subjected to a photolithography process and an etching process, the resist underlayer film has excellent results in view of pattern fidelity, CD (critical dimension) uniformity, surface roughness, etc.

The invention claimed is:
1. A polymer comprising a repeating unit represented by the following Chemical Formula 1:

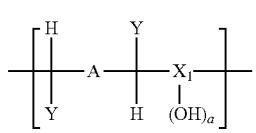

[Chemical Formula 1]

wherein
Y is a substituted or unsubstituted C6-C30 aromatic ring;
A is a substituted or unsubstituted C6-C30 aromatic ring;
$X_1$ is a C10-C30 aromatic ring;
a is an integer of 1 to 4; and
the sum of carbon atoms of Y, A and $X_1$ is at least 30.
2. The polymer of claim 1, wherein the polymer includes a portion represented by the following Chemical Formula 2:

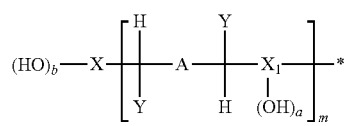

[Chemical Formula 2]

wherein
X is a C10-C30 aromatic ring;
Y is a substituted or unsubstituted C6-C30 aromatic ring;
A is a substituted or unsubstituted C6-C30 aromatic ring;
X1 is a C10-C30 aromatic ring;

a and b are independently of each other an integer of 1 to 4; and m is an integer of 1 to 30.

3. The polymer of claim 2, wherein X and $X_1$ are independently of each other selected from the group consisting of the following structures:

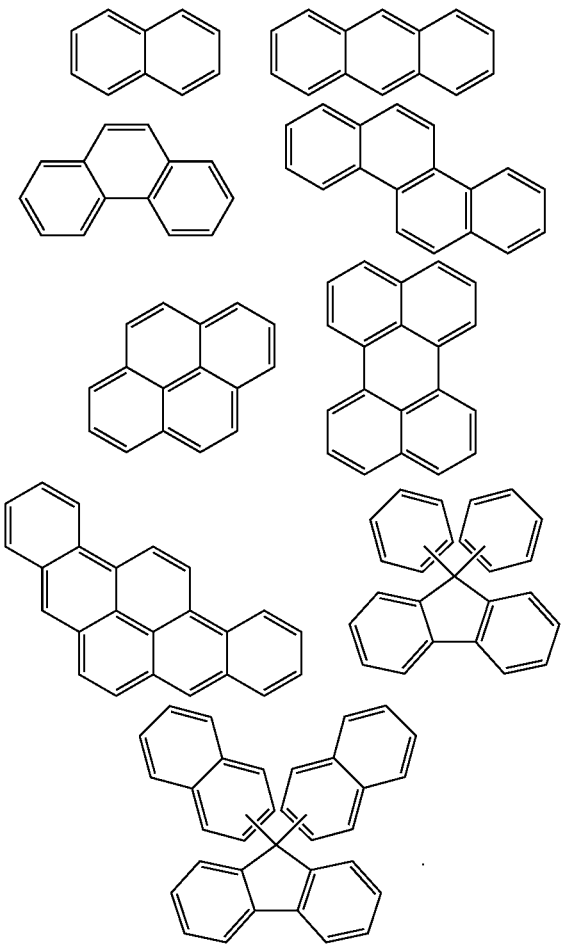

4. The polymer of claim 1, wherein A is selected from the group consisting of the following structures:

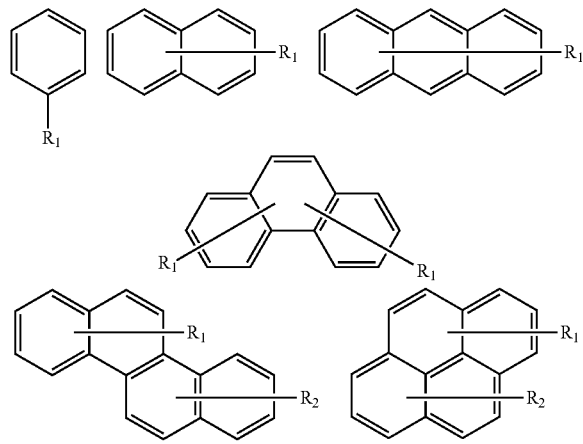

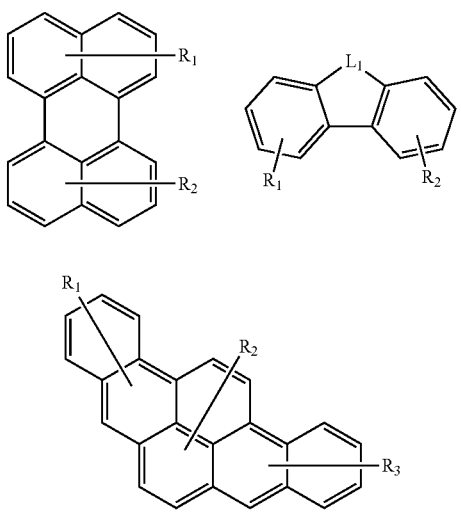

wherein $R_1$ to $R_3$ are independently of one another hydrogen, C1-C20 alkoxy, C3-C20 cycloalkyloxy, C6-C20 aryloxy, $SR_4$, or $NR_5R_6$;

$R_4$ to $R_6$ are independently of each other hydrogen, C1-C20 alkyl, C3-C20 cycloalkyl, or C6-C20 aryl;

$L_1$ is $CR_7R_8$ or $C=R_9$;

$R_7$ and $R_8$ are independently of each other hydrogen, C1-C20 alkyl, C3-C20 cycloalkyl, or C6-C20 aryl; and $R_9$ is C1-C20 alkylidene or C3-C20 cycloalkylidene.

5. The polymer of claim 1, wherein Y is selected from the group consisting of the following structures:

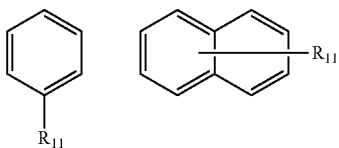

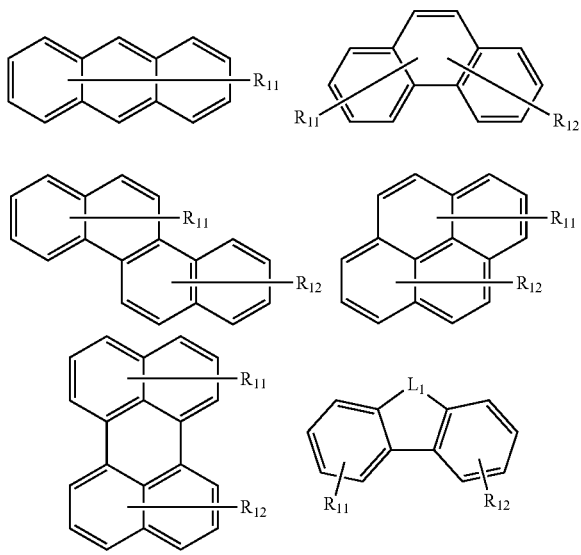

-continued

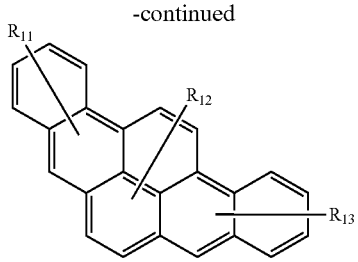

wherein $R_{11}$ to $R_{13}$ are independently of one another hydrogen, C1-C20 alkoxy, C3-C20 cycloalkyloxy, C6-C20 aryloxy, $SR_{14}$, or $NR_{15}R_{16}$;

$R_{14}$ to $R_{16}$ are independently of each other hydrogen, C1-C20 alkyl, C3-C20 cycloalkyl, or C6-C20 aryl;

$L_{11}$ is $CR_{17}R_{18}$ or $C\!=\!R_{19}$;

$R_{17}$ and $R_{18}$ are independently of each other hydrogen, C1-C20 alkyl, C3-C20 cycloalkyl, or C6-C20 aryl; and $R_{19}$ is C1-C20 alkylidene or C3-C20 cycloalkylidene.

6. The polymer of claim 1, wherein the polymer has a weight average molecular weight of 500 to 50,000.

7. The polymer of claim 1, wherein the polymer includes a structure selected from the group consisting of the following structures:

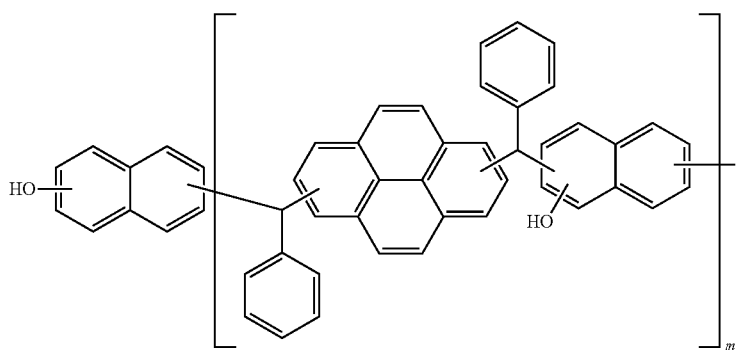

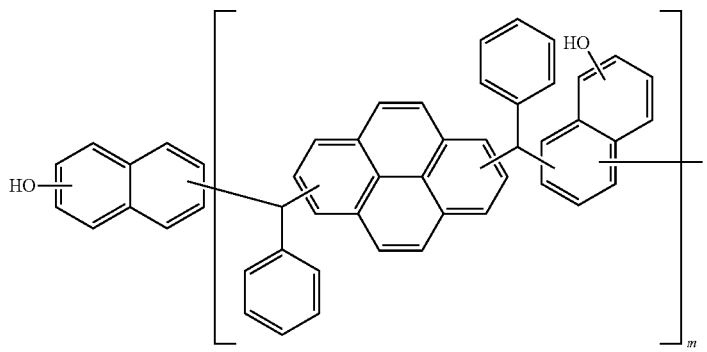

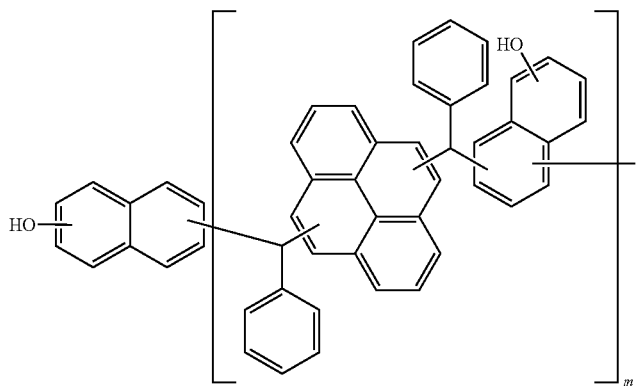

-continued
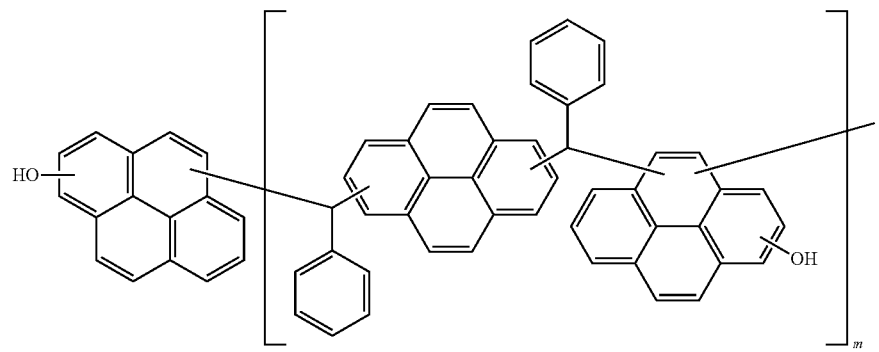
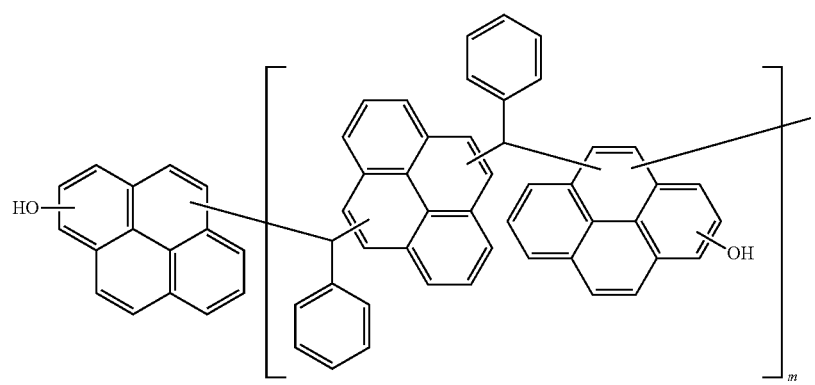
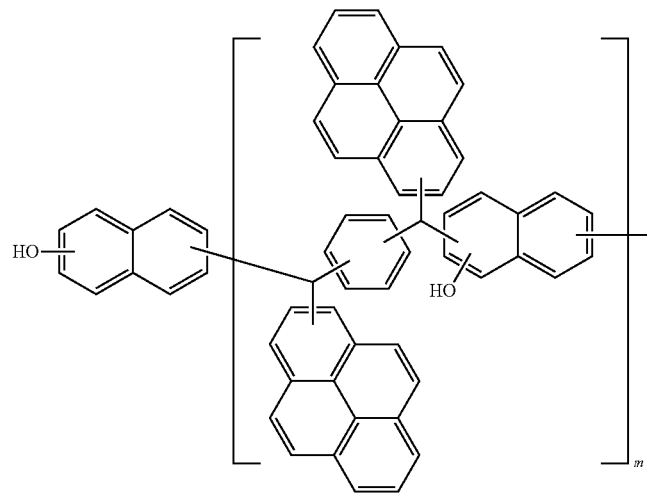
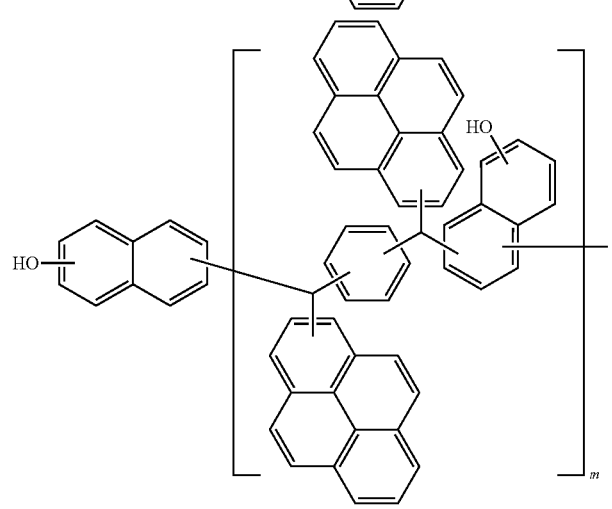

-continued
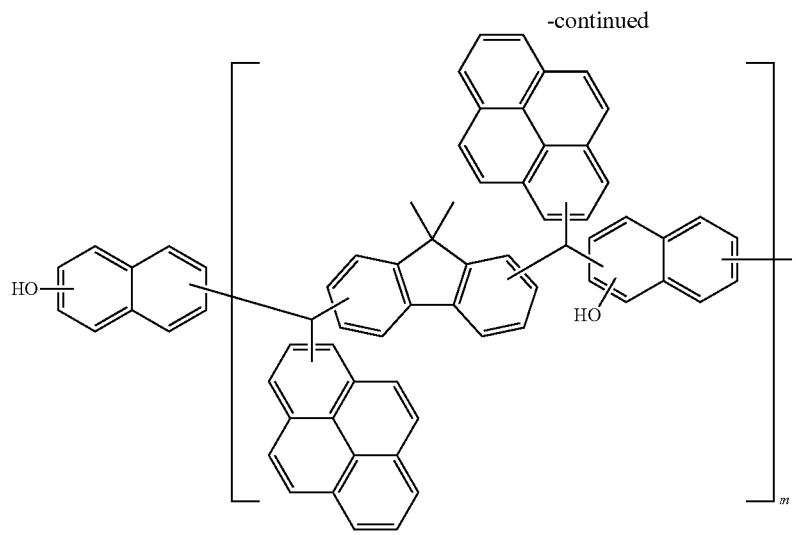
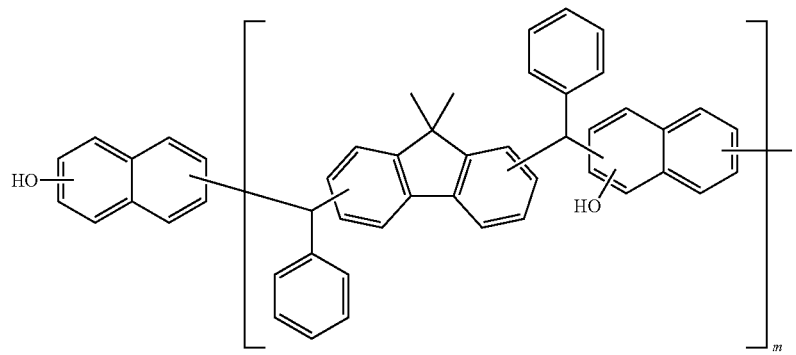
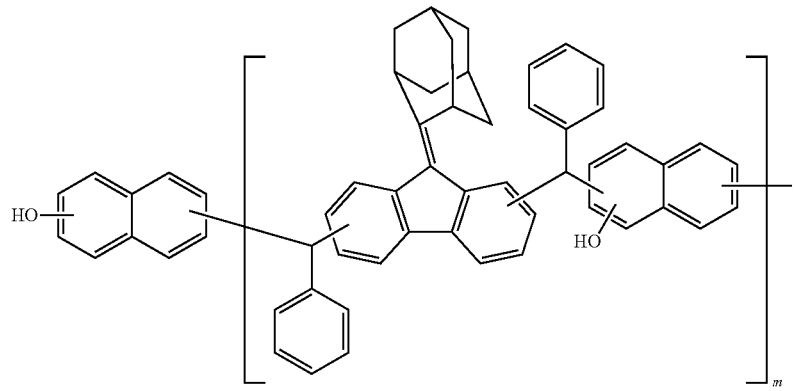
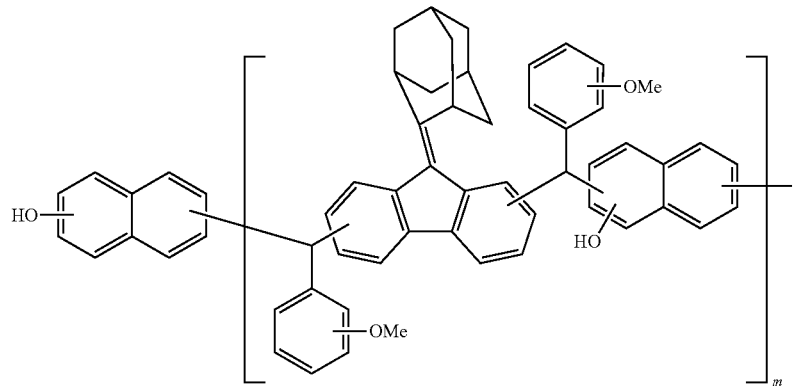

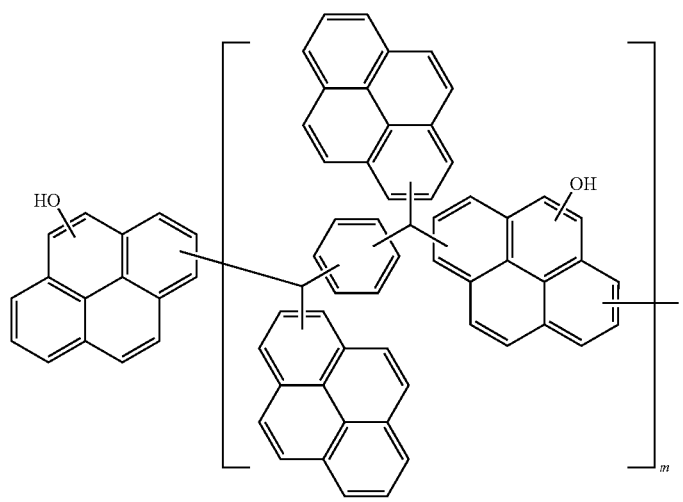
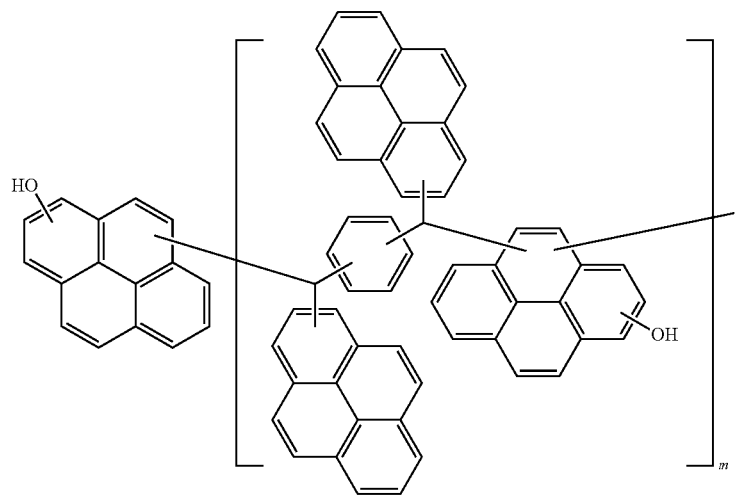
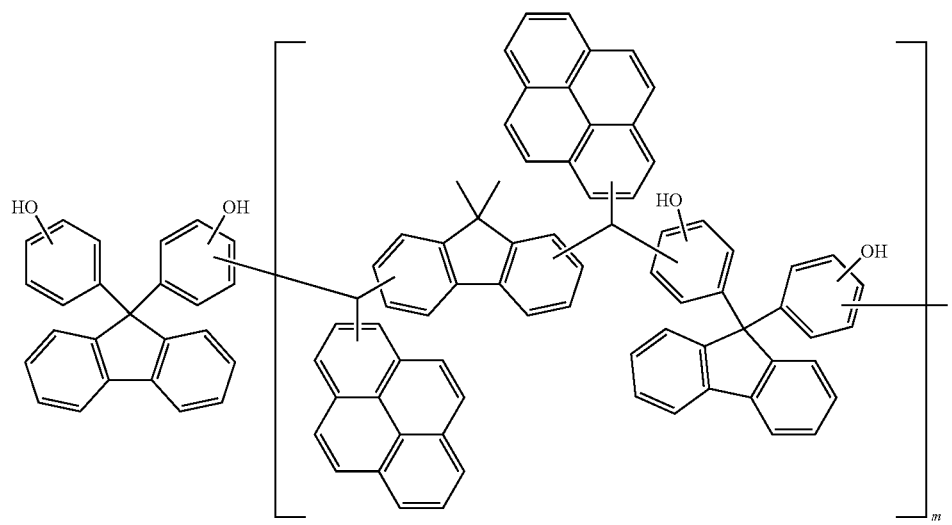

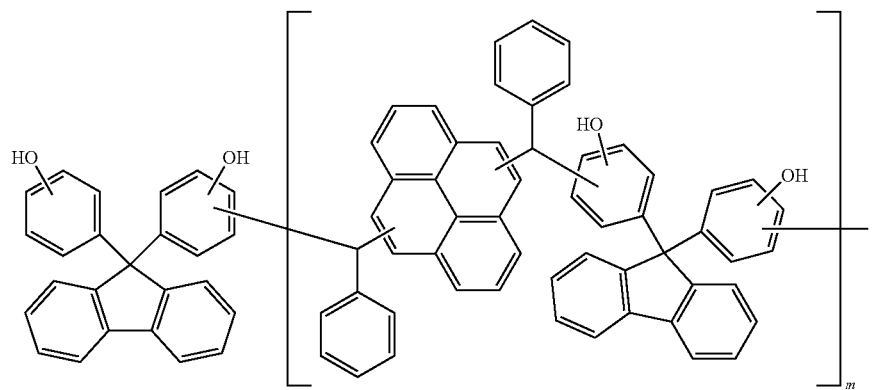
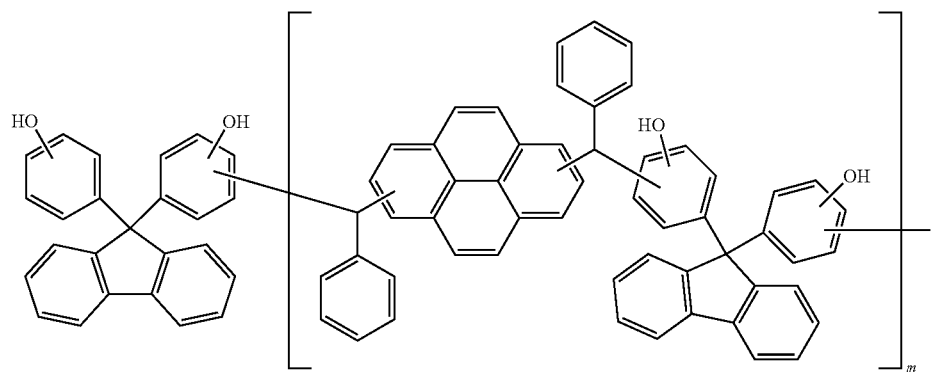
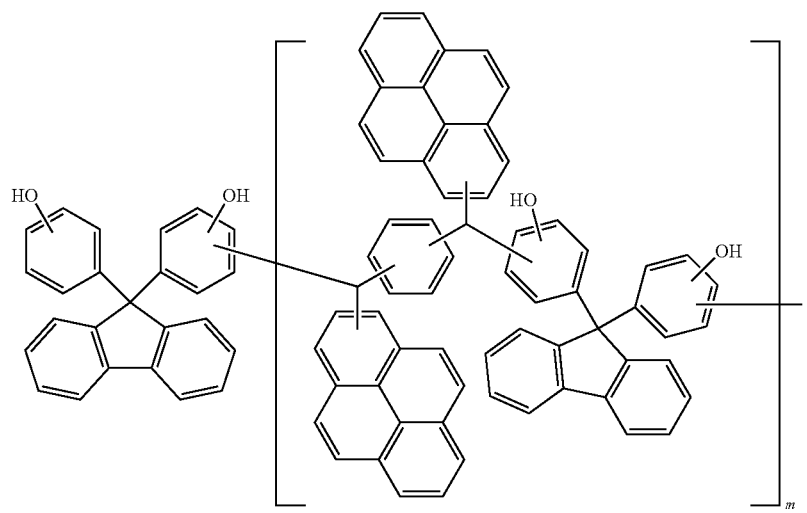

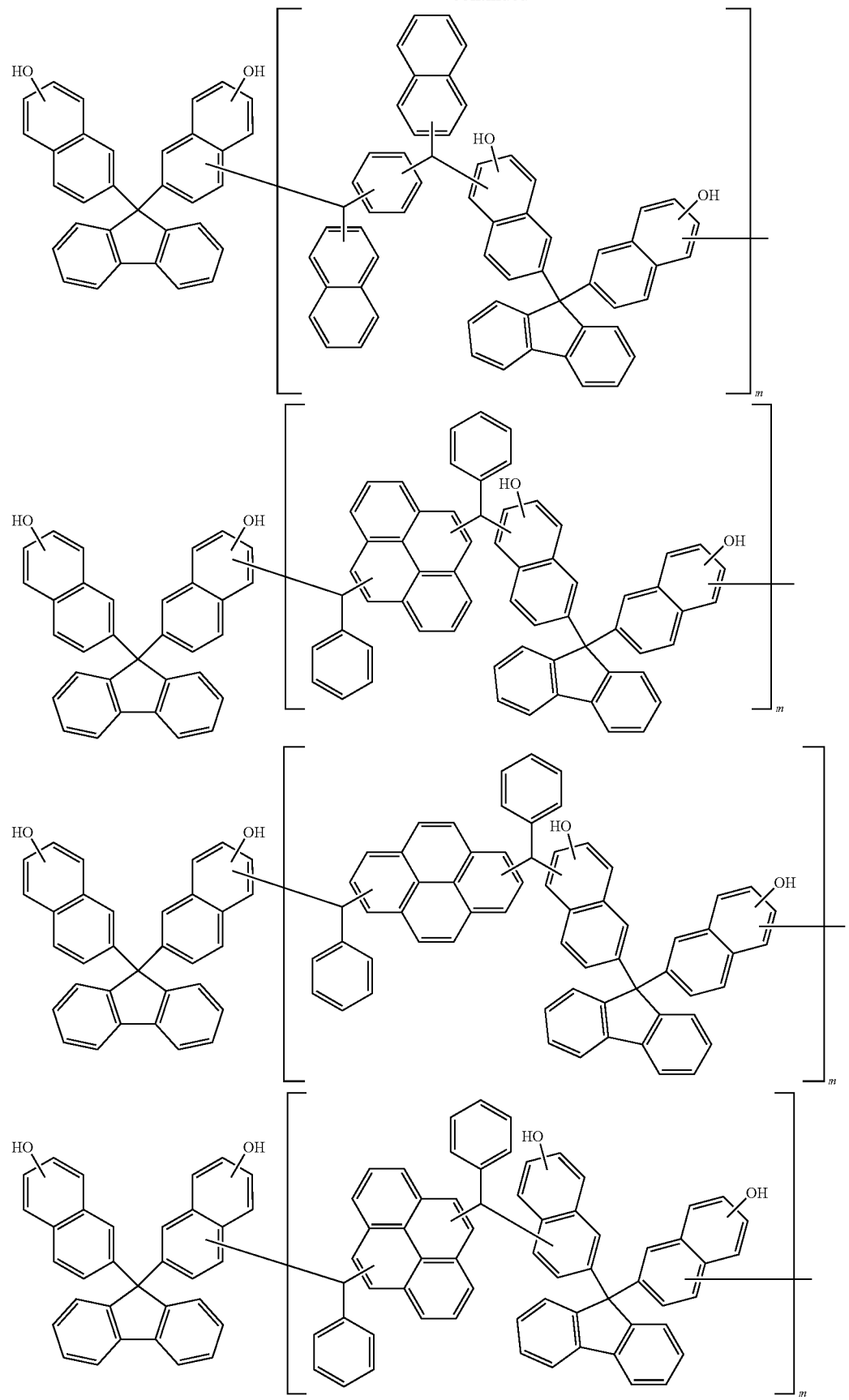

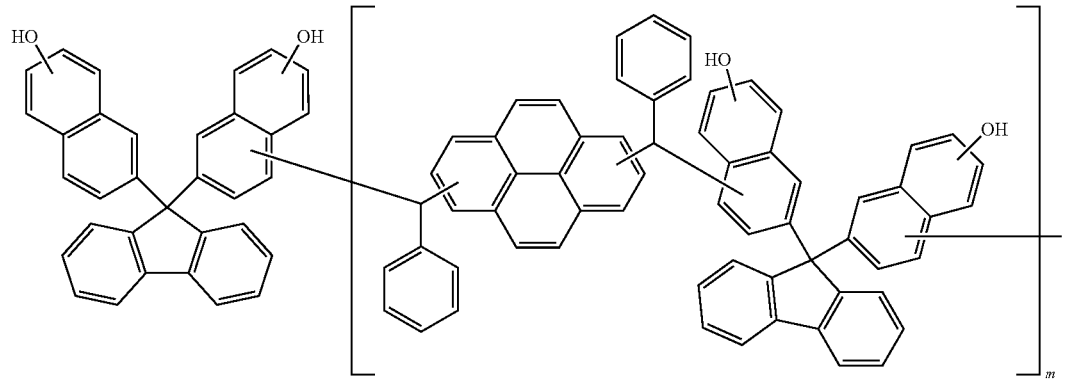
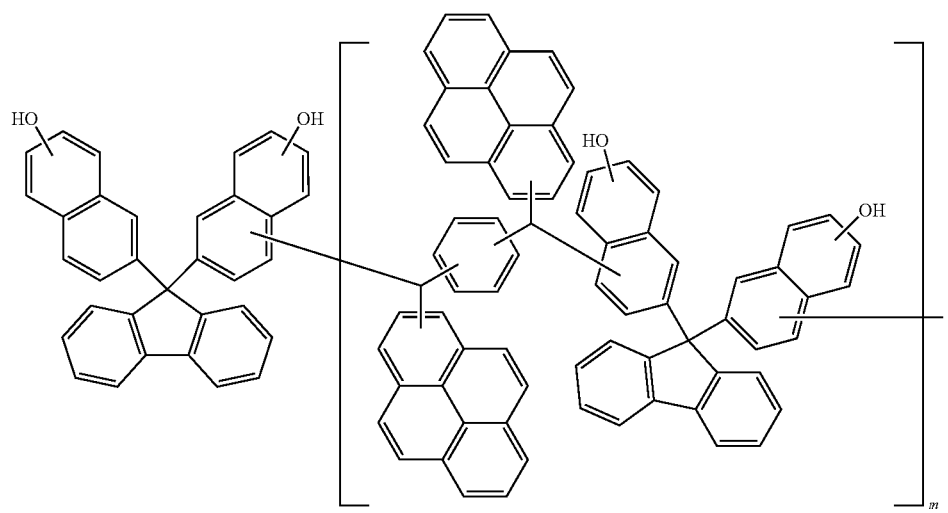
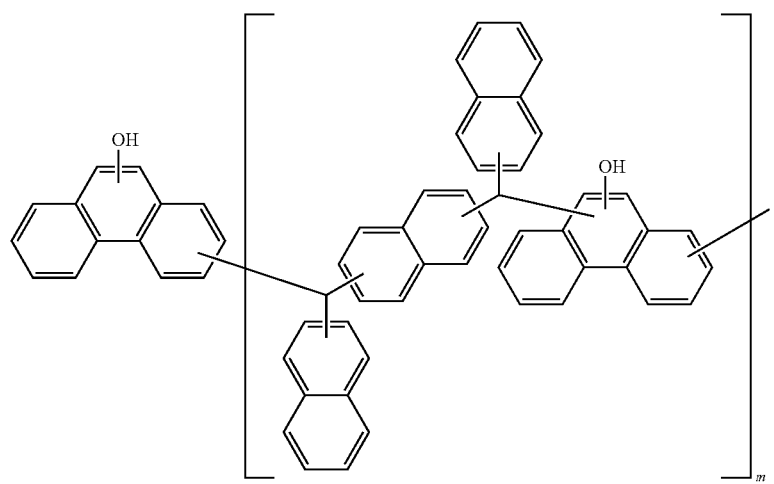

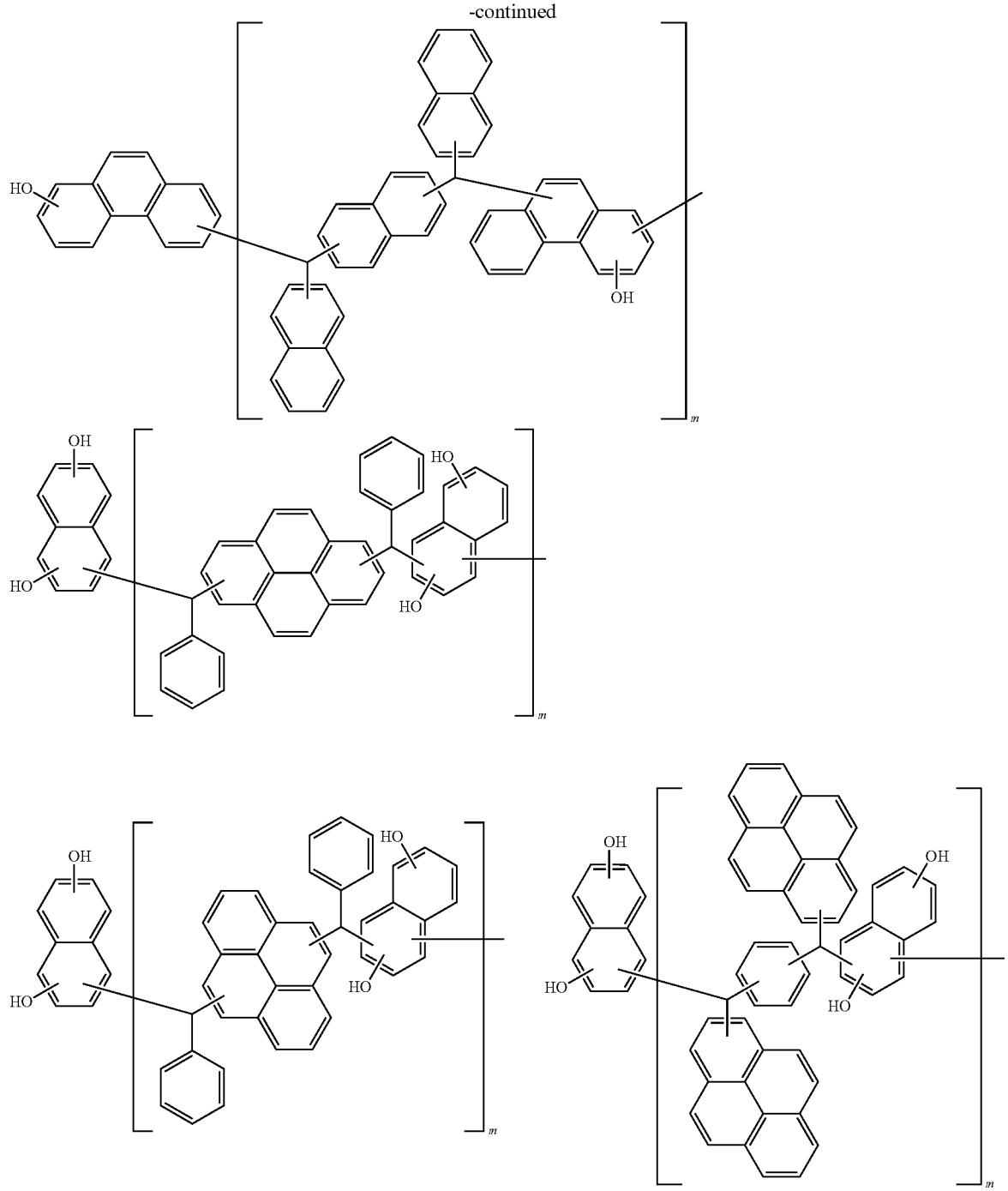

wherein m is an integer of 1 to 30.

8. A resist underlayer film composition comprising the polymer of claim 1 and an organic solvent.

9. The resist underlayer film composition of claim 8, wherein the polymer has an amount of 0.5 to 50 wt % and the organic solvent has an amount of 50 to 99.5 wt %, based on the total amount of the resist underlayer film composition.

10. The resist underlayer film composition of claim 9, wherein the organic solvent is one or more selected from the group consisting of cyclohexanone, 2-heptanone, propyleneglycol monomethyl ether, propyleneglycol monomethyl acetate, propyleneglycol monomethyl ether acetate, gamma-butyrolactone, ethyl lactate, dimethyl sulfoxide, dimethyl acetamide, and N-methyl pyrrolidone.

11. The resist underlayer film composition of claim 8, further comprising one or more additives selected from the group consisting of crosslinking agents, acid catalysts, acid generators, antifoaming agents, and surfactants.

12. The resist underlayer film composition of claim 11, wherein the crosslinking agent is one or more selected from the group consisting of compounds represented by the following Chemical Formulae 4-1 to 4-7:

[Chemical Formula 4-1]

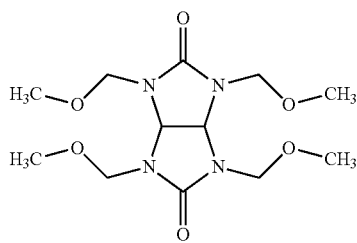

[Chemical Formula 4-2]

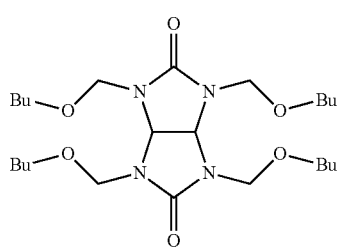

[Chemical Formula 4-3]

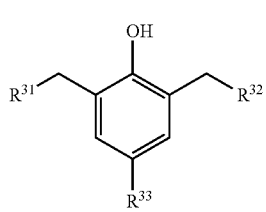

wherein $R^{31}$ and $R^{32}$ are independently of each other hydroxy or C1-C3 alkoxy; and $R^{33}$ is a C1-C10 alkyl,

[Chemical Formula 4-4]

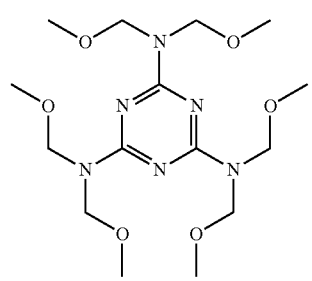

[Chemical Formula 4-5]

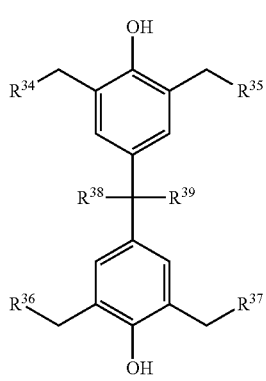

wherein $R^{34}$ to $R^{37}$ are independently of each other hydroxy or C1-C3 alkoxy; and $R^{38}$ and $R^{39}$ are independently of each other hydrogen, C1-C10 alkyl or halo C1-C10 alkyl,

[Chemical Formula 4-6]

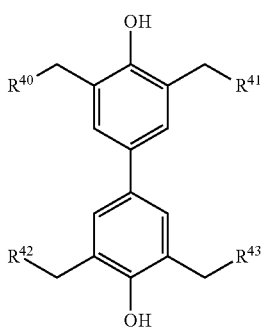

wherein $R^{40}$ to $R^{43}$ are independently of one another hydroxy or C1-C3 alkoxy,

[Chemical Formula 4-7]

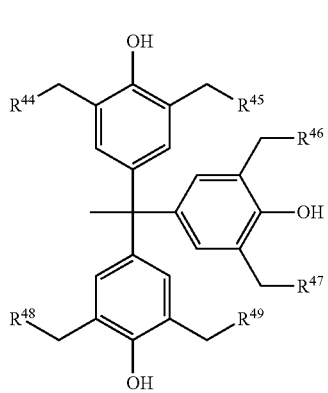

wherein $R^{44}$ to $R^{49}$ are independently of one another hydroxy or C1-C3 alkoxy.

13. The resist underlayer film composition of claim 8, wherein the acid catalyst or the acid generator is one or more selected from the group consisting of compounds represented by the following Chemical Formulae 5-1 to 5-10:

[Chemical Formula 5-1]

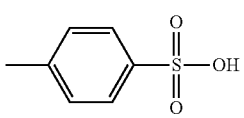

[Chemical Formula 5-2]

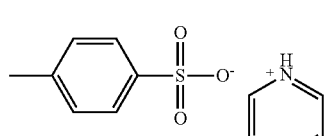

[Chemical Formula 5-3]

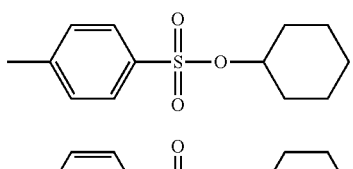

[Chemical Formula 5-4]

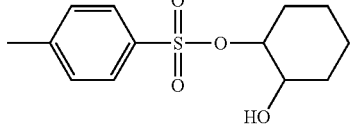

[Chemical Formula 5-5]

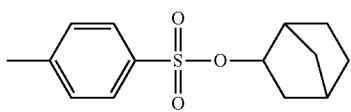

[Chemical Formula 5-6]

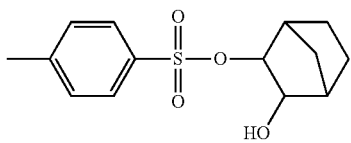

[Chemical Formula 5-7]

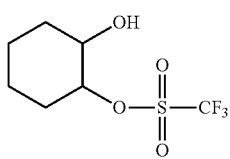

[Chemical Formula 5-8]

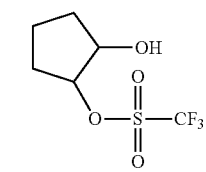

[Chemical Formula 5-9]

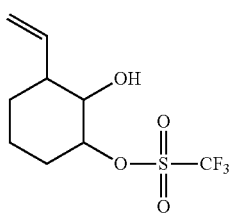

[Chemical Formula 5-10]

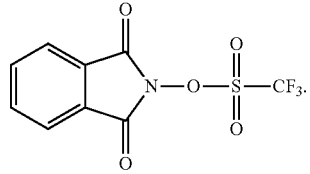

14. A method for manufacturing a semiconductor device comprising:
 a) forming a resist underlayer film by applying and heating the resist underlayer film composition of claim 8 on a substrate;
 b) forming a photoresist film on the resist underlayer film of step a);
 c) forming photoresist patterns by exposing and developing the substrate to which the resist underlayer film and the photoresist film of step b) are applied;
 d) etching the resist underlayer film by using the photoresist patterns of step c) as an etching mask to thereby expose the substrate in a form of the patterns; and
 e) etching an exposed portion of the substrate.

15. The method of claim 14, further comprising before performing step b), forming an inorganic resist underlayer film or a bottom anti-reflective coating (BARC) film on the resist underlayer film of step a).

16. The method of claim 14, wherein in the forming of the photoresist patterns of step c), heating is performed before and/or after the exposing, respectively.

17. The method of claim 14, wherein the light exposing is performed using one or more selected from the group consisting of far-ultraviolet rays (DUV; deep ultra violet) including ArF, KrF and EUV, an electron beam, X-ray and an ion beam.

* * * * *

UNITED STATES PATENT AND TRADEMARK OFFICE
CERTIFICATE OF CORRECTION

PATENT NO. : 11,725,076 B2
APPLICATION NO. : 16/633997
DATED : August 15, 2023
INVENTOR(S) : Minho Jung et al.

Page 1 of 1

It is certified that error appears in the above-identified patent and that said Letters Patent is hereby corrected as shown below:

On the Title Page

Item [71], delete "SK Global Chemical Co., Ltd.," and insert -- SK Geo Centric Co., Ltd., --

In the Claims

Column 45, Lines 55-60, Claim 4, delete " 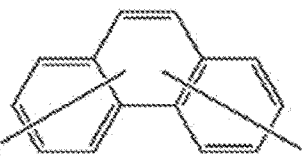 " and insert

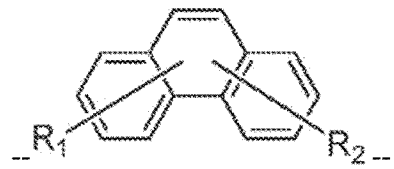 --

Signed and Sealed this
Third Day of October, 2023

*Katherine Kelly Vidal*

Katherine Kelly Vidal
*Director of the United States Patent and Trademark Office*